(12) United States Patent
Ogiwara et al.

(10) Patent No.: US 7,443,709 B2
(45) Date of Patent: Oct. 28, 2008

(54) TEMPERATURE SENSING CIRCUIT, VOLTAGE GENERATION CIRCUIT, AND SEMICONDUCTOR STORAGE DEVICE

(75) Inventors: Ryu Ogiwara, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 11/599,363

(22) Filed: Nov. 15, 2006

(65) Prior Publication Data

US 2007/0121404 A1    May 31, 2007

(30) Foreign Application Priority Data

Nov. 18, 2005   (JP)   ............... 2005-334349

(51) Int. Cl.
*G11C 11/22* (2006.01)
(52) U.S. Cl. ...................... 365/145; 365/211
(58) Field of Classification Search .............. 365/145, 365/211, 210, 207
See application file for complete search history.

(56) References Cited

U.S. PATENT DOCUMENTS

| | | | |
|---|---|---|---|
| 6,574,135 B1 * | 6/2003 | Komatsuzaki | 365/145 |
| 6,587,367 B1 * | 7/2003 | Nishimura et al. | 365/145 |
| 6,728,128 B2 * | 4/2004 | Nishimura et al. | 365/145 |
| 6,898,104 B2 | 5/2005 | Ogiwara et al. | |
| 7,046,541 B2 | 5/2006 | Ogiwara et al. | |
| 7,092,304 B2 | 8/2006 | Ogiwara et al. | |
| 7,266,009 B2 * | 9/2007 | Chandler et al. | 365/145 |
| 2005/0146918 A1 | 7/2005 | Ogiwara et al. | |

FOREIGN PATENT DOCUMENTS

| | | |
|---|---|---|
| JP | 6-347337 | 12/1994 |
| JP | 3689080 | 6/2005 |

* cited by examiner

*Primary Examiner*—Anh Phung
(74) *Attorney, Agent, or Firm*—Finnegan, Henderson, Farabow, Garrett & Dunner, L.L.P.

(57) ABSTRACT

A first bit line is connected to a memory cell. A second bit line is connected to a dummy cell having a dummy capacitor, and supplied with an electric potential which is complementary to the electric potential of the first bit line. A sense amplifier compares and amplifies the first and second bit lines. A sense amplifier supply voltage generation circuit supplies the sense amplifier with a sense amplifier supply voltage to be used in the comparison and amplification by the sense amplifier. The sense amplifier supply voltage is supplied to a reference potential generation circuit. When data is read out from the memory cell to the first bit line, the reference potential generation circuit supplies, to the second bit line via the dummy cell, a reference potential which fluctuates with a positive correlation to the fluctuation in sense amplifier supply voltage.

10 Claims, 21 Drawing Sheets

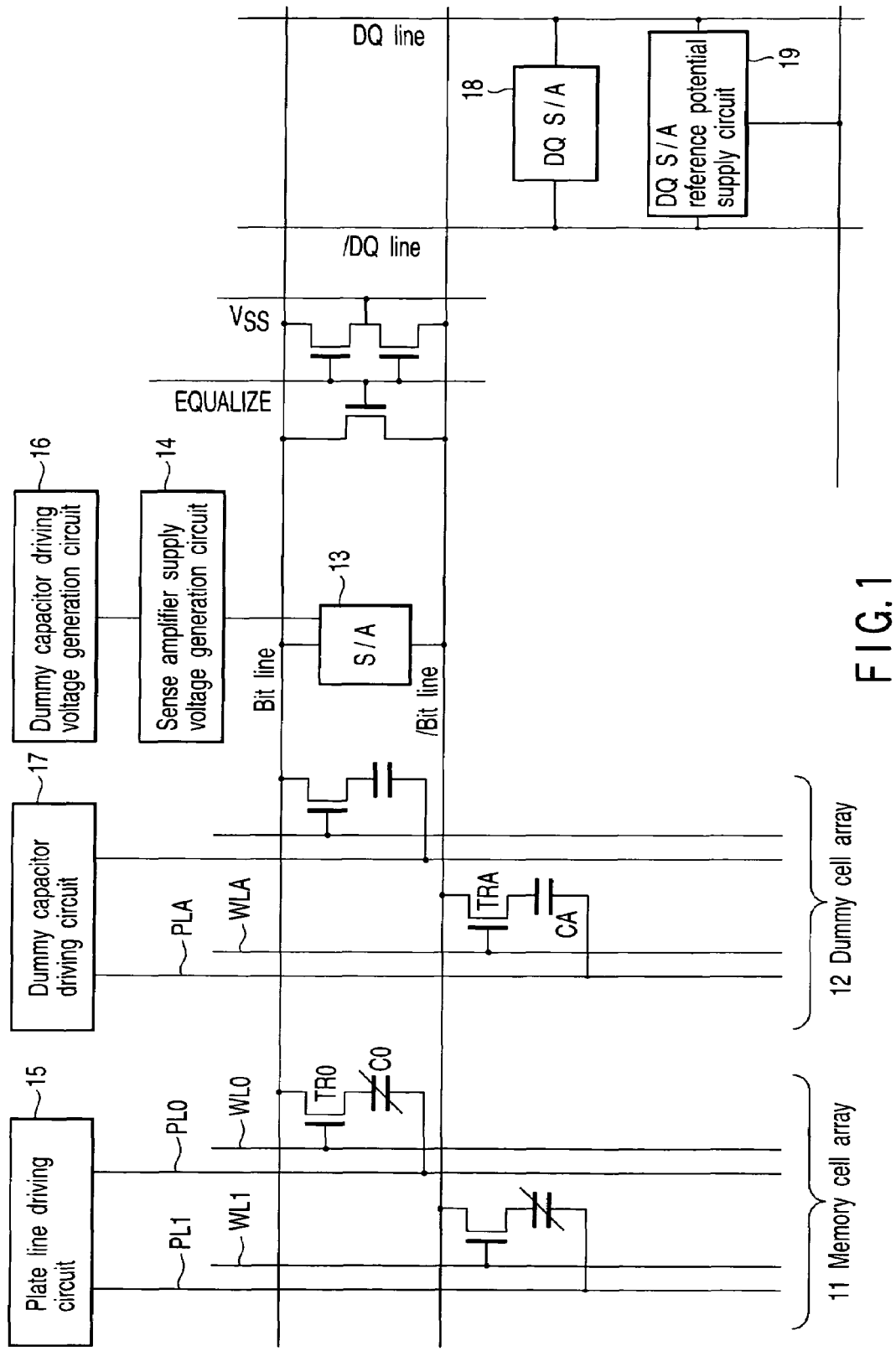
F I G. 1

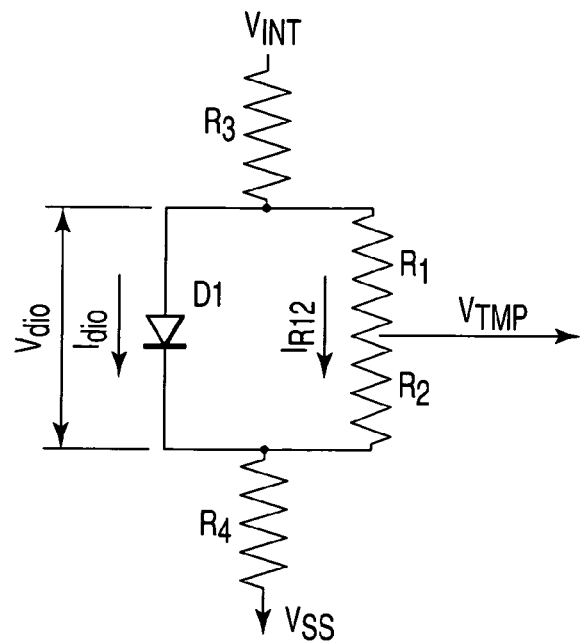
F I G. 15
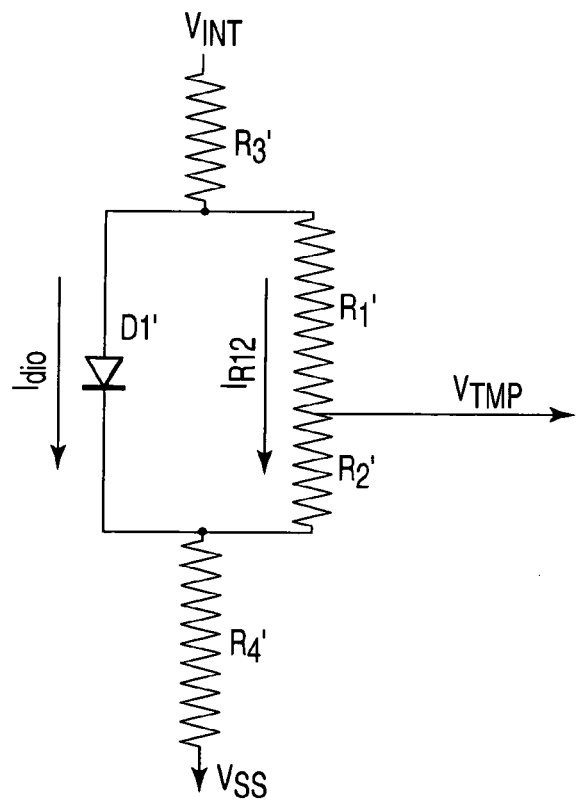
F I G. 16

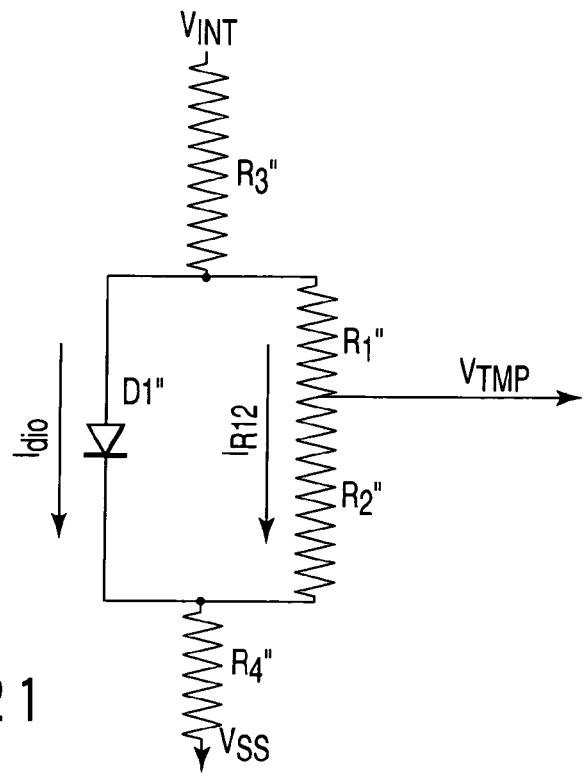
F I G. 21
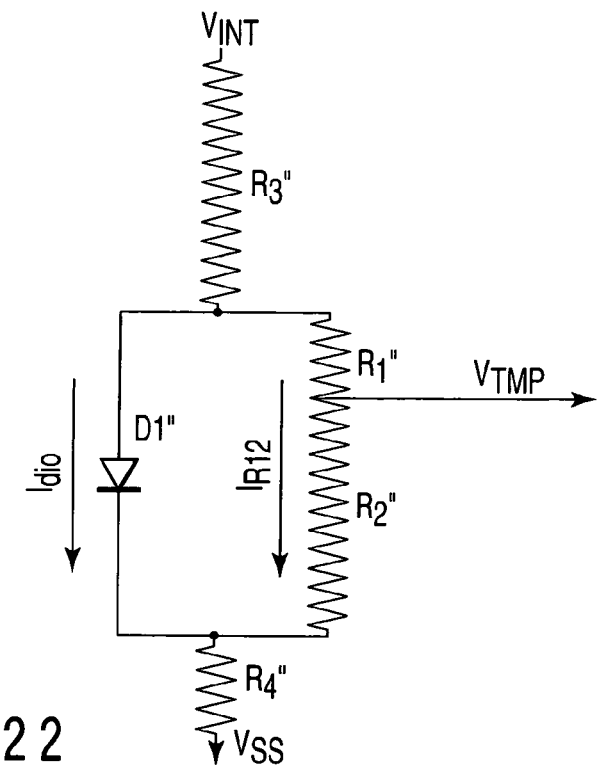
F I G. 22

Resistance value dependences of $V_A$ and $V_B$ when temperature is constant

Resistance value dependences of $V_{BGR}$ and $V_B$ when temperature is constant
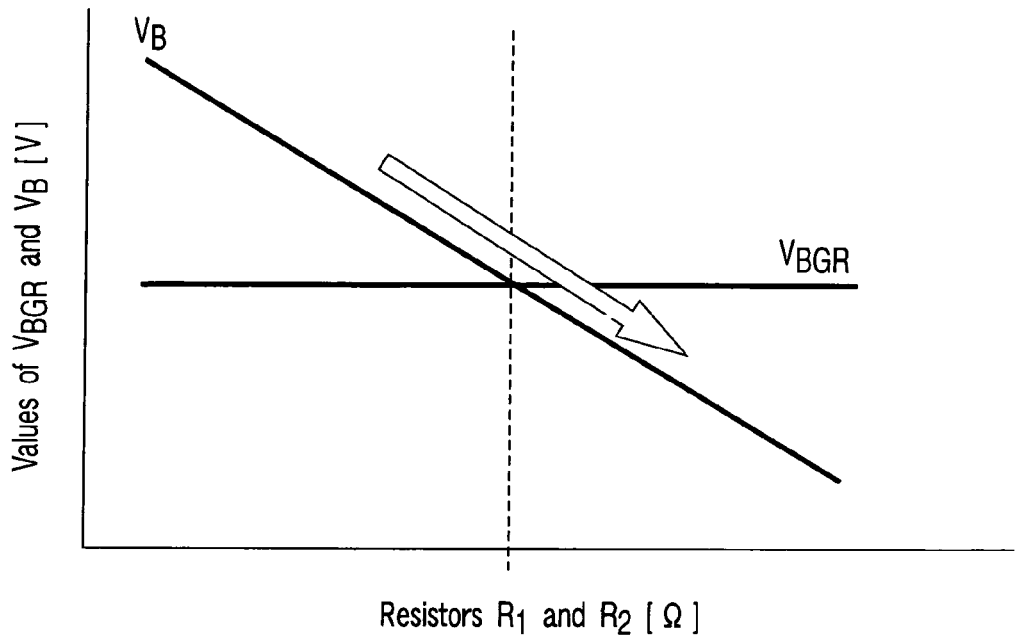
F I G. 3 1
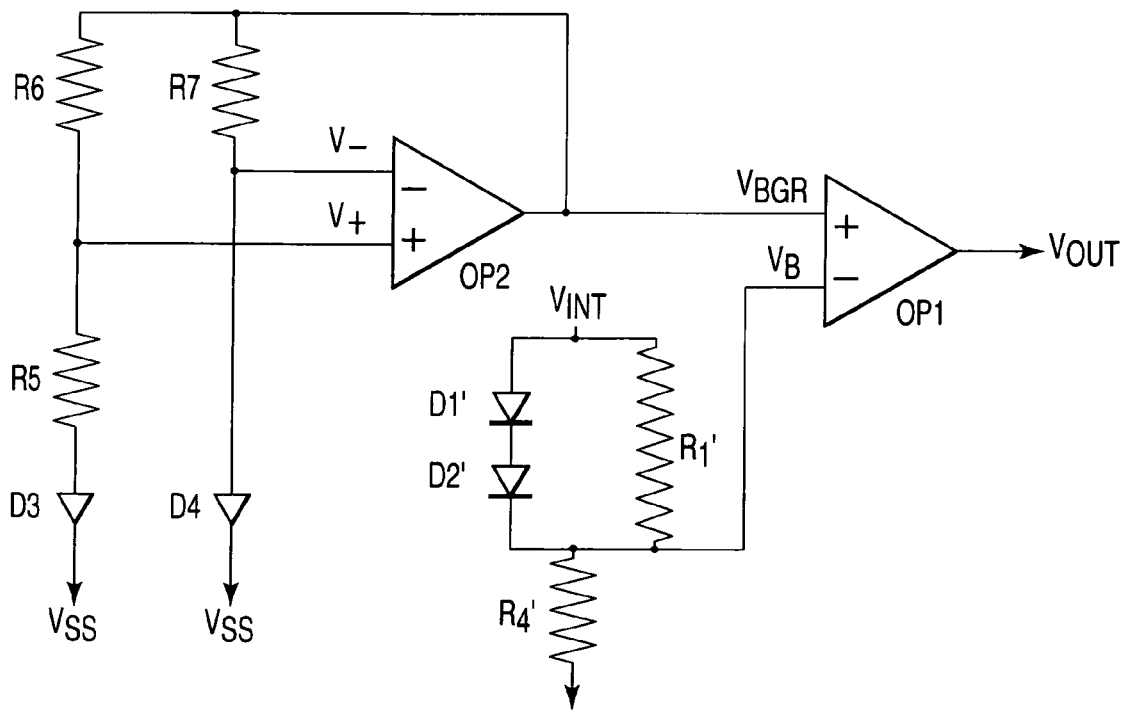
F I G. 3 2

Resistance value dependences of $V_A$ and $V_{BGR}$ when temperature is constant

TEMPERATURE SENSING CIRCUIT, VOLTAGE GENERATION CIRCUIT, AND SEMICONDUCTOR STORAGE DEVICE

CROSS-REFERENCE TO RELATED APPLICATIONS

This application is based upon and claims the benefit of priority from prior Japanese Patent Application No. 2005-334349, filed Nov. 18, 2005, the entire contents of which are incorporated herein by reference.

BACKGROUND OF THE INVENTION

1. Field of the Invention

The present invention relates to a temperature sensing circuit, voltage generation circuit, and semiconductor storage device for use in, e.g., a ferroelectric memory which includes a memory cell using a dielectric capacitor.

2. Description of the Related Art

In conventional semiconductor storage devices, a sense amplifier supply voltage to be supplied to a sense amplifier and used by the sense amplifier to compare and amplify bit line potentials and a dummy capacitor driving voltage to be supplied to a dummy capacitor and used to generate a reference potential which is supplied to one bit line when the bit line potentials are compared and amplified are generated entirely independently of each other. Accordingly, even if the sense amplifier supply voltage used by the sense amplifier to compare and amplify the bit line potentials fluctuates by a leakage current or the like, the dummy capacitor driving voltage for generating the reference voltage does not fluctuate following this fluctuation.

However, letting $\Delta V_{SA}$ be the fluctuation in sense amplifier supply voltage $V_{SA}$ used by the sense amplifier to compare and amplify the bit line potentials and $\Delta V_{DC}$ be the fluctuation in dummy capacitor driving voltage $V_{DC}$, a relationship indicated by $$\Delta V_{DC} \cong \alpha \times \Delta V_{SA} \quad (1)$$

holds. Therefore, it is necessary to make the dummy capacitor driving voltage follow the fluctuation in sense amplifier supply voltage on the basis of a predetermined ratio, but this has not been taken into consideration in any conventional devices.

The dependence of the dummy capacitor driving voltage $V_{DC}$ on the sense amplifier supply voltage $V_{SA}$ will be qualitatively explained below with reference to FIGS. 36A and 36B. First, assume that a residual polarization amount $Pr_{SAL}$ as "1" data is to be read out in FIG. 36A. Letting $V_{PL}$ be an electric potential for driving a plate line, $V_{BL}$ be a bit line potential, and $V_{SAL}$ be a voltage to be supplied to the sense amplifier, the polarization exists in a point A when the plate line is driven, the sense amplifier is activated, and the plate line potential is returned after that.

Also, as shown in FIG. 36B, letting $V_{SAS}$ ($V_{SAL} > V_{SAS}$) be a voltage to be supplied to the sense amplifier, the polarization exists in a point B when the plate line is driven, the sense amplifier is activated, and the plate line potential is returned after that. That is, if the voltage to be supplied to the sense amplifier is low, the polarization moves on a small hysteresis, and the residual polarization amount $Pr_{SAS}$ also decreases. Consequently, a "1" signal potential for the read operation, a middle point between a "0" signal potential distribution and "1" signal potential distribution, and the electric potential of the dummy capacitor driving voltage $V_{DC}$ also decrease.

In addition, a temperature sensing circuit as the prior art includes a circuit in which a diode and resistors Ra and Rb are connected in series, a reference potential $V_{REF}$ independent of the temperature, and an operational amplifier. The reference potential $V_{REF}$ is input to one input terminal of the operational amplifier, and a voltage $V_{TMP}$ at a connecting point between the resistors Ra and Rb is input to the other input terminal. The voltage $V_{TMP}$ is an electric potential depending on the temperature. Therefore, if the reference potential $V_{REF}$ changes, the reference potential $V_{REF}$ at which the output from the operational amplifier inverts also changes in accordance with the temperature. The temperature can be sensed by monitoring the reference potential $V_{REF}$ at which the output from the operational amplifier changes. Unfortunately, this method has the problem that the operating point of the operational amplifier changes.

Furthermore, in a circuit which changes a voltage to be supplied to the circuit in which the diode and resistors Ra and Rb are connected in series, and compares the output voltage $V_{TMP}$ of this series circuit with the reference voltage $V_{REF}$ by the operational amplifier, two types of electric potentials must be supplied, and two operational amplifiers are necessary to supply these electric potentials. This increases the factors of variations in threshold values.

Note that as the prior art related to the temperature sensing circuit described above, a temperature detection circuit is proposed (e.g., Jpn. Pat. Appln. KOKAI Publication No. 6-347337). This temperature detection circuit comprises a first circuit including at least one element which changes its electrical characteristics in accordance with the temperature, and so designed that the output voltage shows a temperature dependence, a second circuit including at least one element which changes its electrical characteristics in accordance with the temperature, and so designed that the output voltage shows a temperature dependence opposite to that of the output voltage of the first circuit, and a comparator which receives the output voltages of the first and second circuits.

BRIEF SUMMARY OF THE INVENTION

A semiconductor storage device of the present invention according to a first aspect comprises: a memory cell which stores information; a first bit line connected to the memory cell; a dummy cell having a dummy capacitor; a second bit line connected to the dummy cell, and supplied with an electric potential complementary to an electric potential of the first bit line; a sense amplifier which compares and amplifies the electric potential of the first bit line and the electric potential of the second bit line; a sense amplifier supply voltage generation circuit which supplies the sense amplifier with a sense amplifier supply voltage to be used in the comparison and amplification by the sense amplifier; and a reference voltage generation circuit which is supplied with the sense amplifier supply voltage and, when data is read out from the memory cell to the first bit line, supplies, to the second bit line via the dummy cell, a reference potential which fluctuates with a positive correlation to a fluctuation in sense amplifier supply voltage.

A voltage generation circuit of the present invention according to a second aspect comprises: a first resistor and diode connected in parallel; a second resistor having one terminal connected to an anode of the diode, and the other terminal supplied with a predetermined voltage; and a third resistor having one terminal connected to a cathode of the diode, and the other terminal connected to a ground potential, wherein a reference voltage for generating an output voltage is output from a node midway along any of the first resistor, the second resistor, and the third resistor.

A temperature sensing circuit of the present invention according to a third aspect comprises: a first circuit which outputs a first voltage having a positive temperature dependence from a connecting point between a first resistor and a second resistor, the first circuit comprising the first resistor and second resistor connected in series, a first diode having an anode connected to one terminal of the series-connected first resistor and second resistor, and a cathode connected to the other terminal of the series-connected first resistor and second resistor, a third resistor having one terminal connected to the anode of the first diode, and the other terminal supplied with a predetermined voltage, and a fourth resistor having one terminal connected to the cathode of the first diode, and the other terminal connected to a ground potential; a second circuit which outputs a second voltage having a negative temperature dependence from a connecting point between a fifth resistor and a sixth resistor, the second circuit comprising the fifth resistor and sixth resistor connected in series, a second diode having an anode connected to one terminal of the series-connected fifth resistor and sixth resistor, and a cathode connected to the other terminal of the series-connected fifth resistor and sixth resistor, a seventh resistor having one terminal connected to the anode of the second diode, and the other terminal supplied with the predetermined voltage, and an eighth resistor having one terminal connected to the cathode of the second diode, and the other terminal connected to the ground potential; and an operational amplifier circuit which receives the first voltage and the second voltage, and outputs a voltage based on a result of an operation using the first voltage and the second voltage.

A temperature sensing circuit of the present invention according to a fourth aspect comprises: a first circuit which outputs a first voltage having a positive temperature dependence from a connecting point between a first resistor and a second resistor, the first circuit comprising the first resistor and second resistor connected in series, a first diode having an anode connected to one terminal of the series-connected first resistor and second resistor, and a cathode connected to the other terminal of the series-connected first resistor and second resistor, a third resistor having one terminal connected to the anode of the first diode, and the other terminal supplied with a predetermined voltage, and a fourth resistor having one terminal connected to the cathode of the first diode, and the other terminal connected to a ground potential; a reference voltage generation circuit which outputs a reference voltage having no temperature dependence; and an operational amplifier circuit which receives the first voltage and the reference voltage, and outputs a voltage based on a result of an operation using the first voltage and the reference voltage.

BRIEF DESCRIPTION OF THE SEVERAL VIEWS OF THE DRAWING

FIG. 1 is a block diagram showing the arrangement of a semiconductor storage device of a first embodiment of the present invention;

FIG. 15 is a circuit diagram showing the basic configuration of first and second circuits in the temperature sensing circuit of the seventh embodiment of the present invention;

FIG. 16 is a circuit diagram showing a first configuration in which the circuit shown in FIG. 15 is given a positive temperature dependence;

FIG. 21 is a circuit diagram showing a first configuration in which the circuit shown in FIG. 15 is given a negative temperature dependence;

FIG. 22 is a circuit diagram showing a second configuration in which the circuit shown in FIG. 15 is given a negative temperature dependence;

FIG. 31 is a graph showing the resistance value dependences of voltages $V_{BGR}$ and $V_B$ in the temperature sensing circuit of the eighth embodiment;

FIG. 32 is a circuit diagram showing the arrangement of a temperature sensing circuit of a modification of the eighth embodiment;

DETAILED DESCRIPTION OF THE INVENTION

Figure 2:
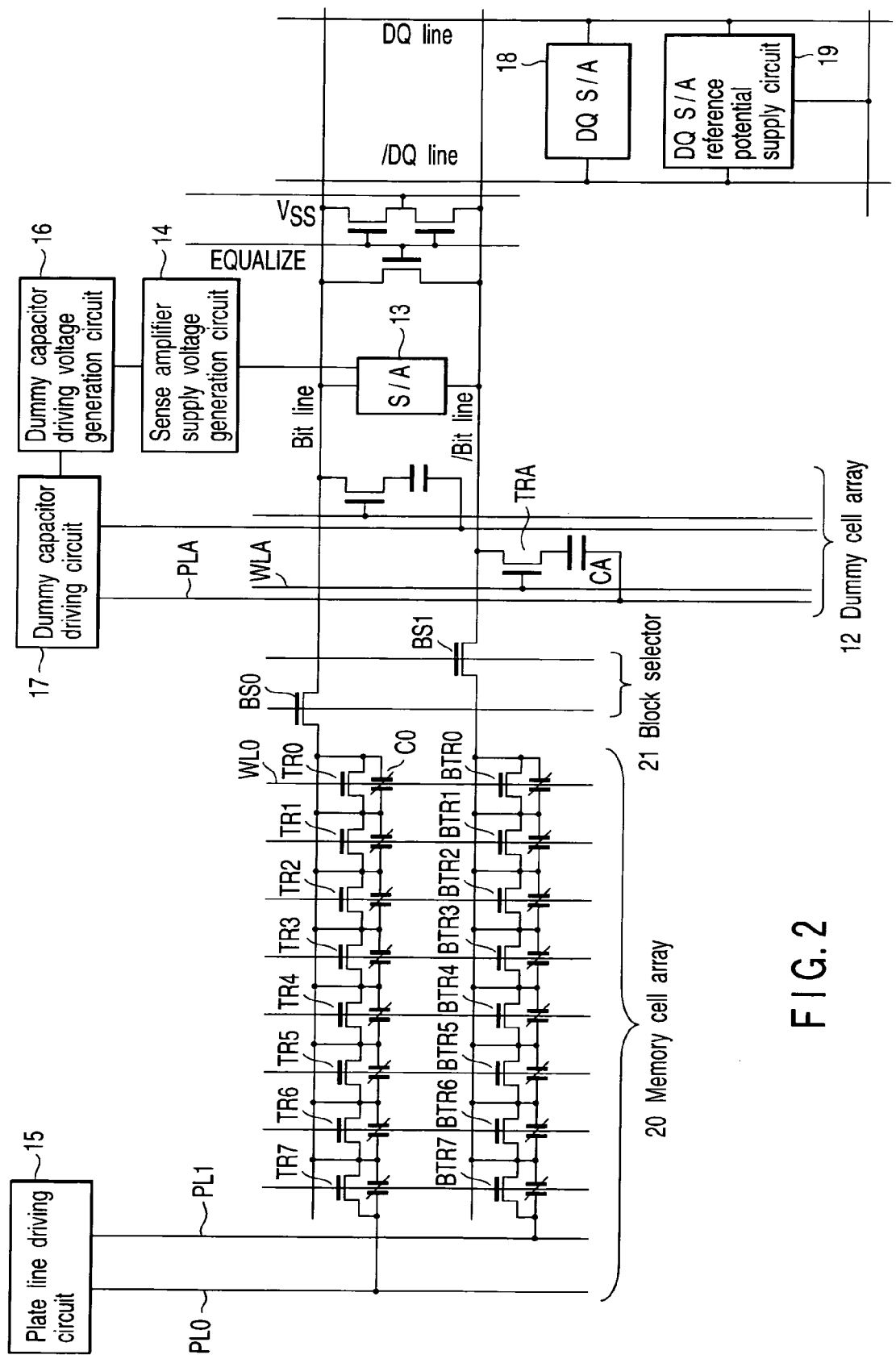
FIG. 2 is a block diagram showing another arrangement of the semiconductor storage device of the first embodiment.

Embodiments of the present invention will be described below with reference to the accompanying drawing. In the following explanation, the same reference numerals denote the same parts throughout the drawing.

First Embodiment

First, a semiconductor storage device including a voltage generation circuit of the first embodiment of the present invention will be described below. In this embodiment, a ferroelectric memory including a ferroelectric capacitor in a memory cell will be taken as an example of the semiconductor storage device.

FIG. 1 is a block diagram showing the arrangement of the semiconductor storage device of the first embodiment. FIG. 1 shows the main parts of a ferroelectric memory.

As shown in FIG. 1, the ferroelectric memory includes a memory cell array 11, dummy cell array 12, sense amplifier (S/A) 13, sense amplifier supply voltage generation circuit 14, plate line driving circuit 15, dummy capacitor driving voltage generation circuit 16, dummy capacitor driving circuit 17, DQ line sense amplifier (DQ S/A) 18, and DQ line sense amplifier reference potential supply circuit 19.

The memory cell array 11 has a plurality of memory cells arranged in a matrix. Each memory cell has an arrangement in which one electrode of a ferroelectric capacitor C0 is connected to the source of a switching transistor TR0, the other electrode of the ferroelectric capacitor C0 is connected to a plate line PL0, the gate of the switching transistor TR0 is connected to a word line WL0, and the drain of the switching transistor TR0 is connected to a bit line.

The dummy cell array 12 has a plurality of dummy cells each having an arrangement in which the two electrodes of a dummy capacitor CA are connected to the source of a MOS transistor TRA and a plate line PLA, the gate of the MOS transistor TRA is connected to a word line WLA, and the drain of the MOS transistor TRA is connected a bit line.

The sense amplifier 13 compares and amplifies the electric potentials of a bit line pair (a bit line and a /bit line complementary to the bit line). The sense amplifier supply voltage generation circuit 14 supplies the sense amplifier with a sense amplifier supply voltage $V_{SA}$ used to compare and amplify the electric potentials of a bit line pair in the sense amplifier. The sense amplifier supply voltage generation circuit 14 also supplies the sense amplifier supply voltage $V_{SA}$ to the dummy capacitor driving voltage generation circuit 16.

The dummy capacitor driving voltage generation circuit 16 supplies the dummy capacitor driving circuit 17 with a dummy capacitor driving voltage $V_{DC}$ which is used to generate a reference potential to be supplied to a /bit line when a bit line and the /bit line are to be compared and amplified. The dummy capacitor driving circuit 17 supplies the dummy capacitor driving voltage $V_{DC}$ to the dummy capacitor CA via the plate line PLA. The dummy capacitor driving voltage generation circuit 16 and dummy capacitor driving circuit 17 function as a reference potential generation circuit which supplies the reference potential to a /bit line via a dummy cell having a dummy capacitor.

In addition, the plate line driving circuit 15 supplies a voltage to the ferroelectric capacitor C0 via the plate line PL0. Also, the DQ sense amplifier (DQ S/A) 18 compares and amplifies the electric potentials of a DQ line pair (a DQ line and a /DQ line complementary to the DQ line) transferred from a bit line. The DQ line sense amplifier reference potential supply circuit 19 supplies a reference potential to the /DQ line.

FIG. 2 is a block diagram showing another configuration of the semiconductor storage device of the first embodiment, and shows the main components of a ferroelectric memory including a ferroelectric capacitor in a memory cell. This ferroelectric memory has the same arrangement as the ferroelectric memory shown in FIG. 1 except for a memory cell array 20 and block selector 21. The block selector 21 selects a memory cell block made up of a plurality of series-connected memory cells included in the memory cell array 20.

The memory cell array 20 has a plurality of arrayed memory cell blocks, and each memory cell block includes a plurality of series-connected memory cells. Each memory cell includes a ferroelectric capacitor C0 and switching transistor TR0. One electrode of the ferroelectric capacitor C0 is connected to the source of the switching transistor TR0, the other electrode of the ferroelectric capacitor C0 is connected to the drain of the switching transistor TR0, and the gate of the switching transistor TR0 is connected to a word line WL0. Each memory cell block includes a plurality of series-connected memory cells, a block selecting MOS transistor BS0, and a plate line PL0. The plate line PL0 is connected to one terminal of the series-connected memory cells, and a bit line is connected to the other terminal via the block selecting MOS transistor BS0.

The dummy capacitor driving voltage generation circuit included in the semiconductor storage devices of the first embodiment shown in FIGS. 1 and 2 will be explained below.

Figure 3:
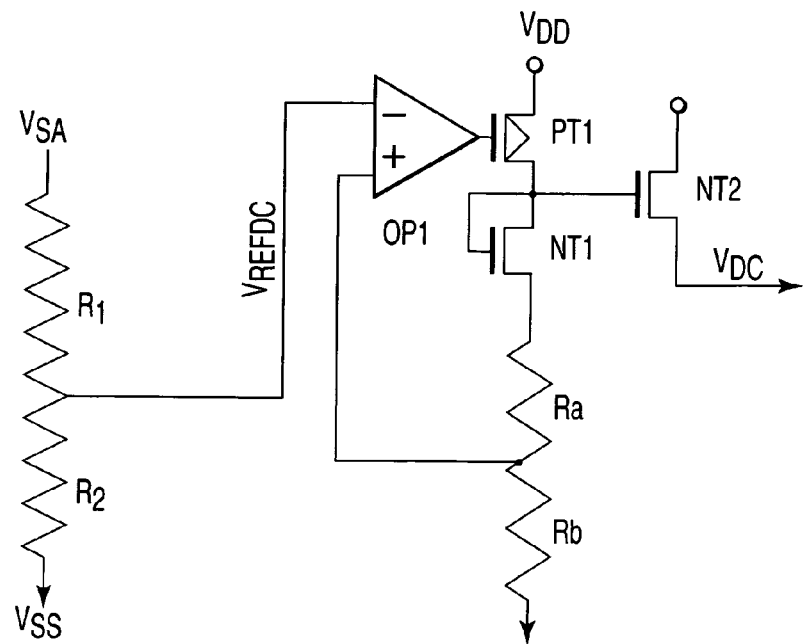
FIG. 3 is a circuit diagram showing the arrangement of a dummy capacitor driving voltage generation circuit included in the semiconductor storage device of the first embodiment.

FIG. 3 is a circuit diagram showing the configuration of the dummy capacitor driving voltage generation circuit included in the above semiconductor storage devices. In this voltage generation circuit, a reference voltage $V_{REFDC}$ is extracted midway along a resistor string connecting the sense amplifier supply voltage $V_{SA}$ to be supplied to the sense amplifier and a ground potential $V_{SS}$, thereby making the reference voltage $V_{REFDC}$ and dummy capacitor driving voltage $V_{DC}$ follow the fluctuation in sense amplifier supply voltage $V_{SA}$.

As shown in FIG. 3, the negative (−) input terminal of an operational amplifier circuit (to be referred to as an operational amplifier hereinafter) OP1 is connected to a node between resistors $R_1$ and $R_2$, and supplied with the reference voltage $V_{REFDC}$. The positive (+) input terminal of the operational amplifier OP1 is connected to a node between resistors Ra and Rb. The output terminal of the operational amplifier OP1 is connected to the gate of a p-channel MOS transistor PT1. The drain of the p-channel MOS transistor PT1 is connected to the drain and gate of an n-channel MOS transistor NT1, and to the gate of an n-channel MOS transistor NT2.

One terminal of the resistor $R_1$ and one terminal of the resistor $R_2$ are connected. The other terminal of the resistor $R_1$ is supplied with the sense amplifier supply voltage $V_{SA}$, and the other terminal of the resistor $R_2$ is connected to, e.g., the ground potential $V_{SS}$. Also, a power supply voltage $V_{DD}$ is supplied to the source of the p-channel MOS transistor PT1. One terminal of the resistor Ra and one terminal of the resistor Rb are connected. The other terminal of the resistor Ra is connected to the source of the n-channel MOS transistor NT1, and the other terminal of the resistor Rb is connected to the ground potential $V_{SS}$. In addition, the power supply voltage $V_{DD}$ is supplied to the drain of the n-channel MOS transistor NT2, and the source of the transistor NT2 outputs the dummy capacitor driving voltage $V_{DC}$.

The sense amplifier supply voltage $V_{SA}$ is a power supply voltage supplied to the sense amplifier, and is used to compare and amplify the electric potentials of a bit line pair (a bit line and a /bit line complementary to the bit line) in the sense amplifier. The dummy capacitor driving voltage $V_{DC}$ is a voltage supplied to the dummy capacitor via the plate line, and is used to generate a reference potential to be supplied to a /bit line when a bit line and the /bit line are compared and amplified.

The voltage generation circuit having the above configuration has the following relationships.

$$V_{REFDC}=V_{SA}\times R_2/(R_1+R_2) \quad (2)$$

$$\Delta V_{REFDC}=\Delta V_{SA}\times R_2/(R_1+R_2) \quad (3)$$

$$\Delta V_{DC}=\Delta V_{SA}\times R_2/(R_1+R_2)\times V_{DC}/V_{REFDC} \quad (4)$$

$$\Delta V_{DC}=\Delta V_{SA}\times V_{DC}/V_{SA} \quad (5)$$

α in expression (1) is $$\alpha=V_{DC}/V_{SA} \quad (6)$$

It is possible to make the dummy capacitor driving voltage $V_{DC}$ follow the fluctuation in sense amplifier supply voltage $V_{SA}$ at the ratio α. Since this allows the reference potential used in the sense amplifier to follow the fluctuation in sense amplifier supply voltage $V_{SA}$, a sufficient sense margin can be assured in the sense amplifier. In addition, when the sense amplifier supply voltage $V_{SA}$ is to be generated by using a voltage down converter using source-followered n cannel MOS transistor, it is also possible, by appropriately selecting the absolute values of the resistors $R_1$ and $R_2$, to use a bleeder circuit of the voltage generation circuit which keeps flowing a constant electric current to the resistors $R_1$ and $R_2$. This reduces the power consumption.

Second Embodiment

A semiconductor storage device including a voltage generation circuit of the second embodiment of the present invention will be described below. The arrangement of the semiconductor storage device is the same as the first embodiment shown in FIGS. 1 and 2, and an explanation thereof will be omitted.

Figure 4:
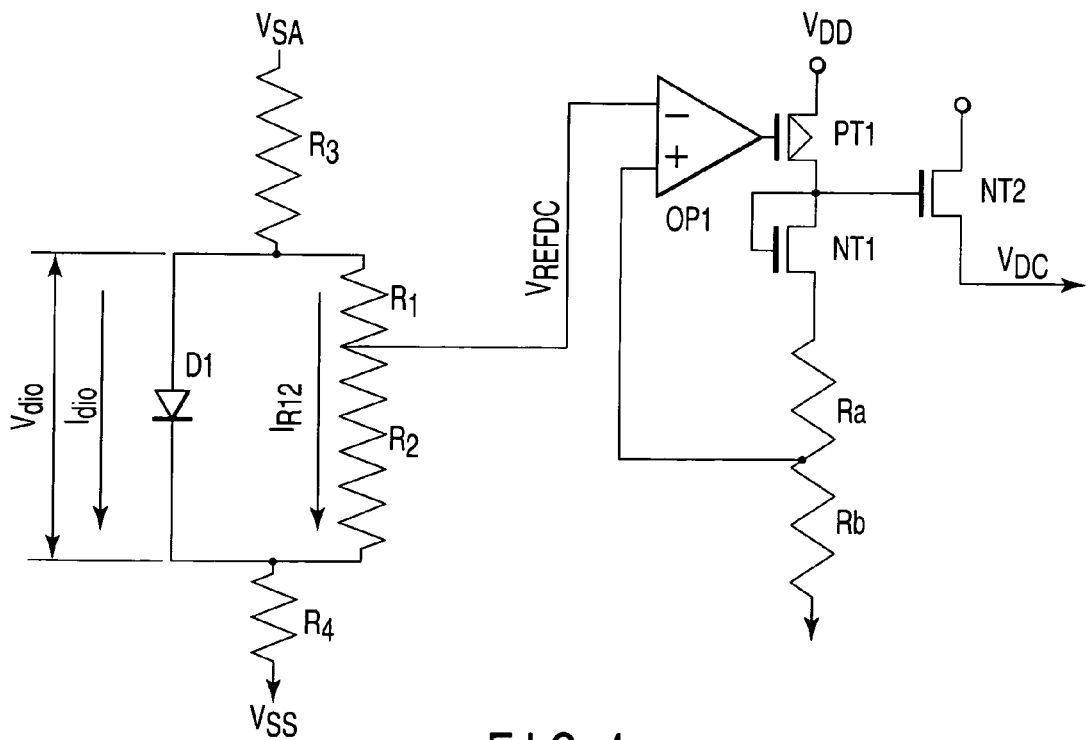
FIG. 4 is a circuit diagram showing the arrangement of a dummy capacitor driving voltage generation circuit included in a semiconductor storage device of a second embodiment of the present invention.

FIG. 4 is a circuit diagram showing the configuration of a dummy capacitor driving voltage generation circuit included in the semiconductor storage device of the second embodiment. In this voltage generation circuit, a diode D1 is connected in parallel to the two terminals of series-connected resistors $R_1$ and $R_2$, and resistors $R_3$ and $R_4$ are connected to the two terminals of the diode D1, in the voltage generation circuit shown in FIG. 3. More specifically, the resistor $R_3$ is connected to the anode (p-type semiconductor region) of the diode D1, and the resistor $R_4$ is connected to the cathode (n-type semiconductor region) of the diode D1. Furthermore, a sense amplifier supply voltage $V_{SA}$ is supplied to the resistor $R_3$, and a ground potential $V_{SS}$ is connected to the resistor $R_4$. The rest of the arrangement is the same as the first embodiment.

A voltage which is output from a node between the resistors $R_1$ and $R_2$ to the negative input terminal of an operational amplifier OP1 is a reference voltage $V_{REFDC}$. Letting $I_{dio}$ be an electric current flowing through the diode D1, $I_{R12}$ be an electric current flowing through the resistors $R_1$ and $R_2$ connected in parallel to the diode D1, and $V_{dio}$ be the voltage across the two terminals of the diode D1, the reference voltage $V_{REFDC}$ is $$V_{REFDC}=\{V_{SA}-(I_{dio}+I_{R12})\times(R_3+R_4)\}\times R_2/(R_1+R_2)+ (I_{dio}+I_{R12})\times R_4 \quad (7)$$

Also, assuming that the sense amplifier supply voltage $V_{SA}$ fluctuates by $\Delta V_{SA}$ owing to a leakage current or the like, the fluctuation in reference voltage $V_{REFDC}$ is $$\Delta V_{REFDC}=\Delta V_{SA}\times R_4/(R_3+R_4) \quad (8)$$

Accordingly, the fluctuation in dummy capacitor driving voltage $V_{DC}$ is $$\Delta V_{DC}=\Delta V_{SA}\times R_4/(R_3+R_4)\times V_{DC}/V_{REFDC} \quad (9)$$

Hence, a ratio α of the fluctuation width of the dummy capacitor driving voltage $V_{DC}$ to that of the sense amplifier supply voltage $V_{SA}$, which is defined by expression (1), is $$\alpha=R_4/(R_3+R_4)\times V_{DC}/V_{REFDC} \quad (10)$$

It is possible, by adjusting the resistance values of the resistors $R_3$ and $R_4$, to make the dummy capacitor driving voltage $V_{DC}$ follow the actual fluctuation width of the sense amplifier supply voltage $V_{SA}$. Since this allows a reference potential used in a sense amplifier to follow the fluctuation in sense amplifier supply voltage $V_{SA}$, a sufficient sense margin can be assured in the sense amplifier. In addition, when the sense amplifier supply voltage $V_{SA}$ is to be generated by using a voltage down converter using source-followered n cannel MOS transistor, it is also possible, by appropriately selecting the absolute values of the resistors $R_1$ and $R_2$, to use a bleeder circuit of the voltage generation circuit which keeps flowing a constant electric current to the resistors $R_1$ and $R_2$. This reduces the power consumption.

Third Embodiment

A semiconductor storage device including a voltage generation circuit of the third embodiment of the present invention will be described below. The arrangement of the semiconductor storage device is the same as the first embodiment shown in FIGS. 1 and 2, and an explanation thereof will be omitted.

Figure 5:
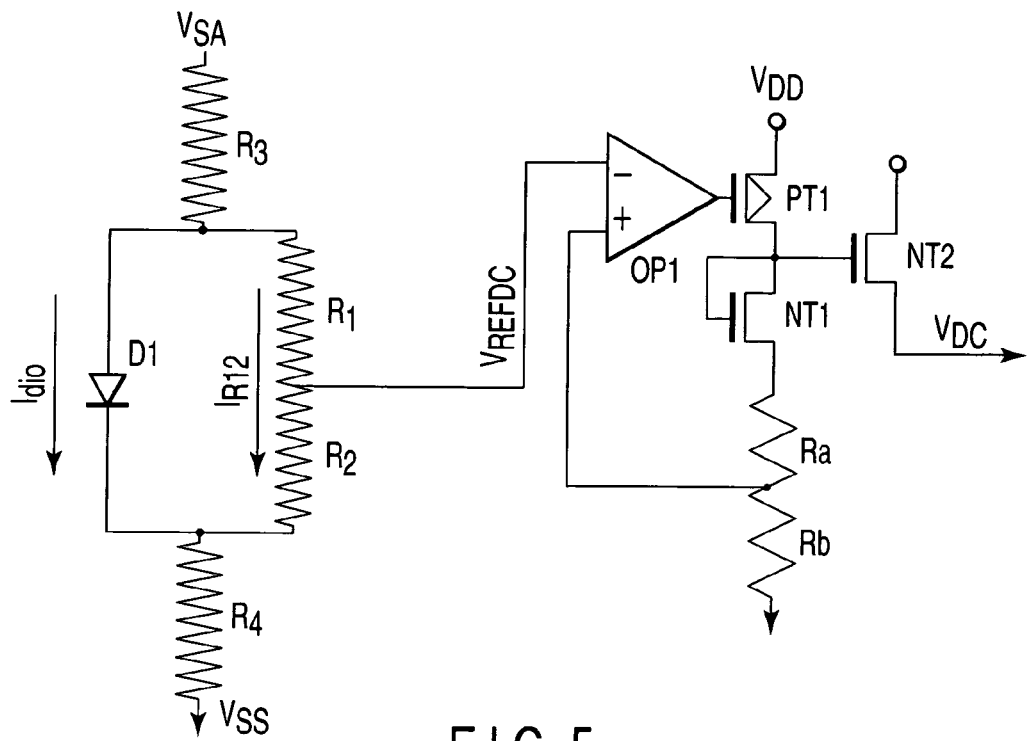
FIG. 5 is a circuit diagram showing the arrangement of a dummy capacitor driving voltage generation circuit included in a semiconductor storage device of a third embodiment of the present invention.

FIG. 5 is a circuit diagram showing the configuration of a dummy capacitor driving voltage generation circuit included in the semiconductor storage device of the third embodiment. In the second embodiment described above, no temperature dependence is taken into consideration. In the third embodiment explained below, however, a case in which no temperature dependence is given to a reference voltage $V_{REFDC}$ will be described first. To give no temperature dependence to the reference voltage $V_{REFDC}$, the following condition is added.

$$R_1/R_2 = R_3/R_4 \tag{11}$$

Also, as shown in FIG. 5, especially when $$R_1 = R_2 \tag{12}$$

$$R_3 = R_4 \tag{13}$$

the reference voltage $V_{REFDC}$ is $$V_{REFDC} = (1/2) \times V_{SA} \tag{14}$$

Furthermore, substituting equations (12) and (13) into equation (10), $$\alpha = V_{DC}/V_{SA} \tag{15}$$

Therefore, it is possible to make a dummy capacitor driving voltage $V_{DC}$ follow the fluctuation in sense amplifier supply voltage $V_{SA}$ at a ratio α. Since this allows a reference potential used in a sense amplifier to follow the fluctuation in sense amplifier supply voltage $V_{SA}$, a sufficient sense margin can be assured in the sense amplifier. In addition, when the sense amplifier supply voltage $V_{SA}$ is to be generated by using a voltage down converter using source-followered n cannel MOS transistor, it is also possible, by appropriately selecting the absolute values of resistors $R_1$ to $R_4$, to use a bleeder circuit of the voltage generation circuit which keeps flowing a constant electric current to the resistors $R_1$ and $R_4$. This reduces the power consumption.

Fourth Embodiment

A semiconductor storage device including a voltage generation circuit of the fourth embodiment of the present invention will be described below. The arrangement of the semiconductor storage device is the same as the first embodiment shown in FIGS. 1 and 2, and an explanation thereof will be omitted.

Figure 6:
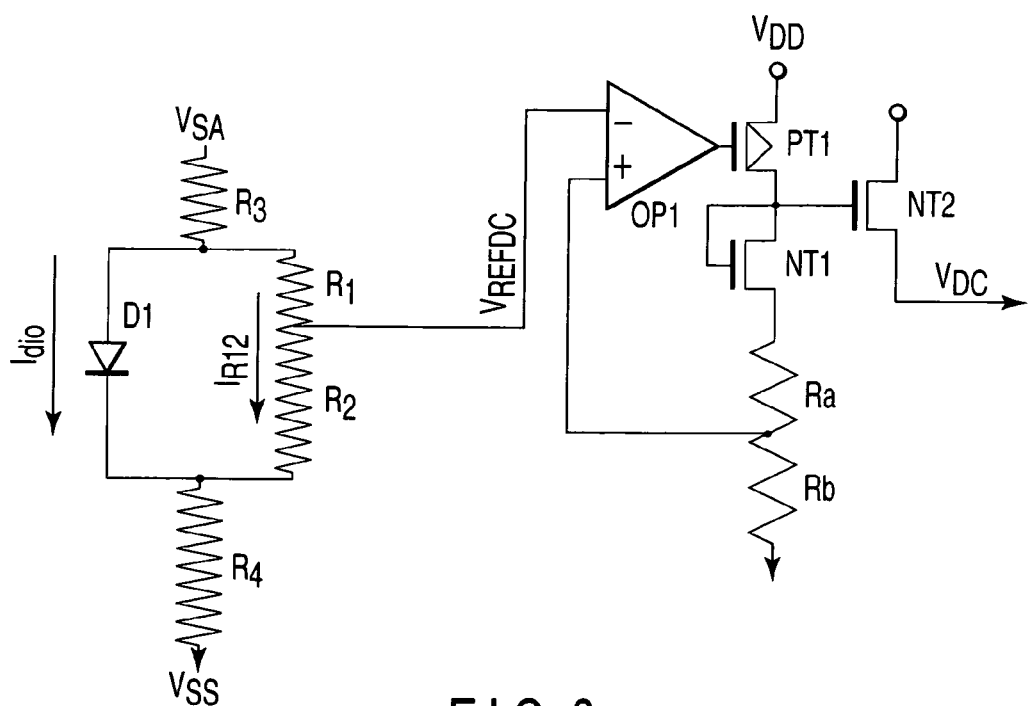
FIG. 6 is a circuit diagram showing the arrangement of a dummy capacitor driving voltage generation circuit included in a semiconductor storage device of a fourth embodiment of the present invention.

FIG. 6 is a circuit diagram showing the configuration of a dummy capacitor driving voltage generation circuit included in the semiconductor storage device of the fourth embodiment. In the third embodiment described above, no temperature dependence is given, and the value of the reference voltage $V_{REFDC}$ is made half that of the sense amplifier supply voltage $V_{SA}$ as indicated by equation (14) by setting the same resistance value for the resistors $R_1$ and $R_2$ and the same resistance value for the resistors $R_3$ and $R_4$ as indicated by equations (12) and (13). In the fourth embodiment, as shown in FIG. 6, especially when $$R_1 = (1/2) \times R_2 \tag{16}$$

$$R_3 = (1/2) \times R_4 \tag{17}$$

a reference voltage $V_{REFDC}$ is $$V_{REFDC} = (2/3) \times V_{SA} \tag{18}$$

Also, substituting equations (17) and (18) into equation (10), $$\alpha = V_{DC}/V_{SA} \tag{19}$$

Therefore, it is possible to make a dummy capacitor driving voltage $V_{DC}$ follow the fluctuation in sense amplifier supply voltage $V_{SA}$ at a ratio α. Since this allows a reference potential used in a sense amplifier to follow the fluctuation in sense amplifier supply voltage $V_{SA}$, a sufficient sense margin can be assured in the sense amplifier. In addition, when the sense amplifier supply voltage $V_{SA}$ is to be generated by using a voltage down converter using source-followered n cannel MOS transistor, it is also possible, by appropriately selecting the absolute values of resistors $R_1$ to $R_4$, to use a bleeder circuit of the voltage generation circuit which keeps flowing a constant electric current to the resistors $R_1$ and $R_4$. This reduces the power consumption.

Fifth Embodiment

A semiconductor storage device including a voltage generation circuit of the fifth embodiment of the present invention will be described below. The arrangement of the semiconductor storage device is the same as the first embodiment shown in FIGS. 1 and 2, and an explanation thereof will be omitted.

Figure 7:
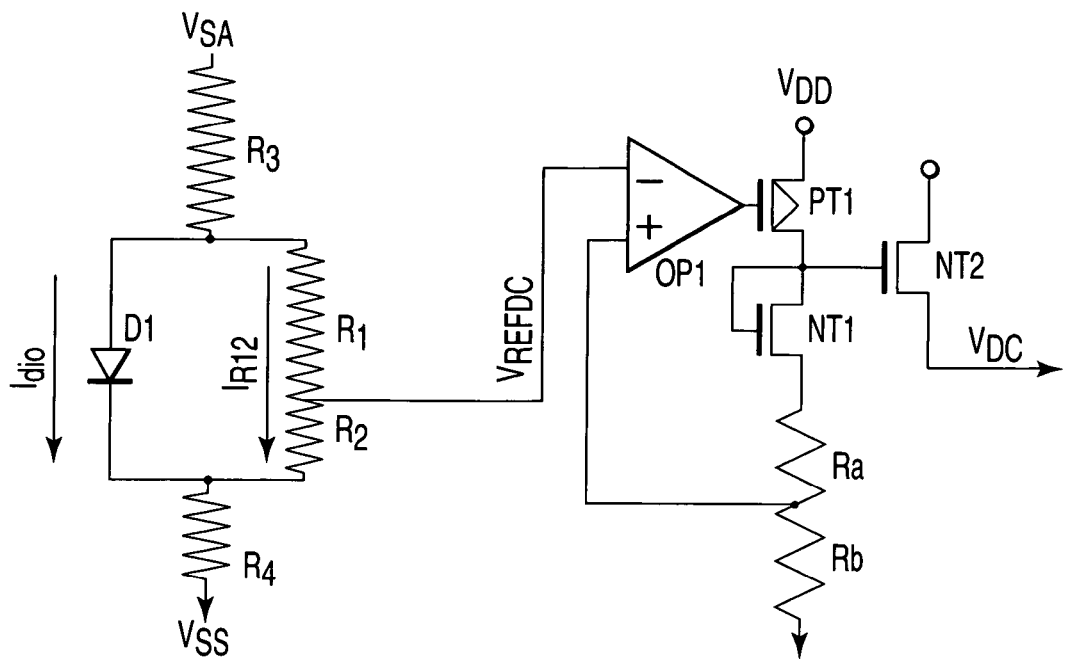
FIG. 7 is a circuit diagram showing the arrangement of a dummy capacitor driving voltage generation circuit included in a semiconductor storage device of a fifth embodiment of the present invention.

FIG. 7 is a circuit diagram showing the configuration of a dummy capacitor driving voltage generation circuit included in the semiconductor storage device of the fifth embodiment. In the fourth embodiment described above, no temperature dependence is given, and the value of a reference voltage $V_{REFDC}$ is made 2/3 that of a sense amplifier supply voltage $V_{SA}$ as indicated by equation (18) by setting the resistance values of resistors $R_1$ to $R_4$ such that $R_1:R_2$ and $R_3:R_4$ are 1:2 as indicated by equations (16) and (17).

In the fifth embodiment, as shown in FIG. 7, especially when $$R_1 = 2 \times R_2 \tag{20}$$

$$R_3 = 2 \times R_4 \tag{21}$$

a reference voltage $V_{REFDC}$ is $$V_{REFDC} = (1/3) \times V_{SA} \tag{22}$$

Also, substituting equations (21) and (22) into equation (10), $$\alpha = V_{DC}/V_{SA} \tag{23}$$

Therefore, it is possible to make a dummy capacitor driving voltage $V_{DC}$ follow the fluctuation in sense amplifier supply voltage $V_{SA}$ at a ratio α. Since this allows a reference potential used in a sense amplifier to follow the fluctuation in sense amplifier supply voltage $V_{SA}$, a sufficient sense margin can be assured in the sense amplifier. In addition, when the sense amplifier supply voltage $V_{SA}$ is to be generated by using a voltage down converter using source-followered n cannel MOS transistor, it is also possible, by appropriately selecting the absolute values of resistors $R_1$ to $R_4$, to use a bleeder circuit of the voltage generation circuit which keeps flowing a constant electric current to the resistors $R_1$ and $R_4$. This reduces the power consumption.

Sixth Embodiment

A semiconductor storage device including a voltage generation circuit of the sixth embodiment of the present invention will be described below. The arrangement of the semiconductor storage device is the same as the first embodiment shown in FIGS. 1 and 2, and an explanation thereof will be omitted.

In each of the third, fourth, and fifth embodiments described above, no temperature dependence is given to the reference voltage $V_{REFDC}$, i.e., no temperature dependence is given to the dummy capacitor driving voltage $V_{DC}$. In the sixth embodiment, however, a dummy capacitor driving voltage $V_{DC}$ is given a temperature dependence.

Figure 8:
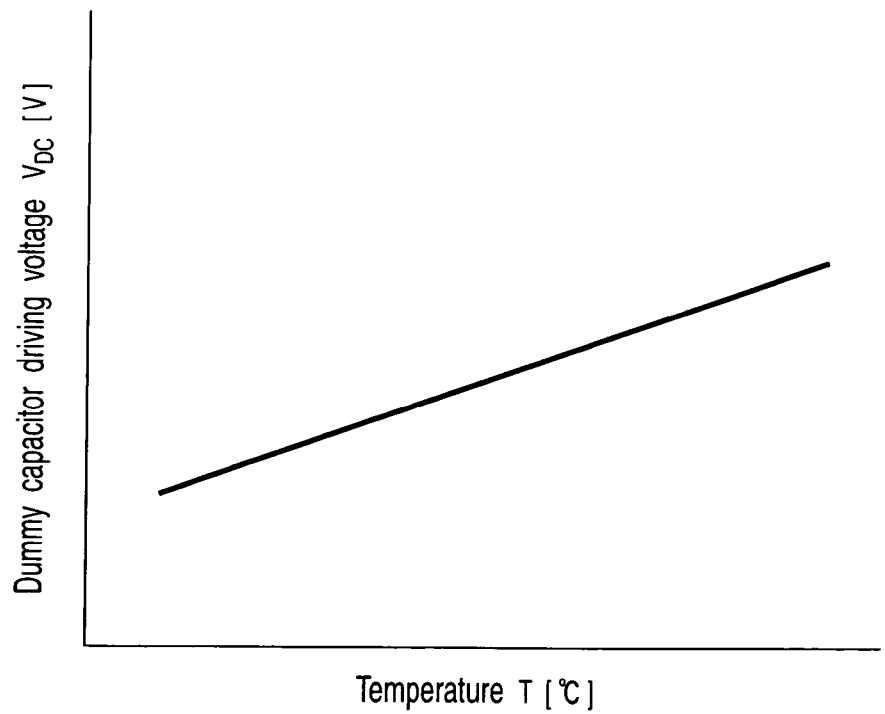
FIG. 8 is a graph showing the temperature dependence of a dummy capacitor driving voltage output from a dummy capacitor driving voltage generation circuit according to an embodiment of the present invention.

FIG. 8 is a graph showing the temperature dependence of the dummy capacitor driving voltage $V_{DC}$ obtained by an experiment. The temperature is plotted on the abscissa, and the value of the dummy capacitor driving voltage $V_{DC}$ is plotted on the ordinate. As shown in FIG. 8, the value of the dummy capacitor driving voltage $V_{DC}$ rises as the temperature rises.

FIGS. 9 to 12 are circuit diagrams showing the configurations of dummy capacitor driving voltage generation circuits included in the semiconductor storage device of the sixth embodiment, in each of which the dummy capacitor driving voltage $V_{DC}$ is given a temperature dependence.

Figure 9:
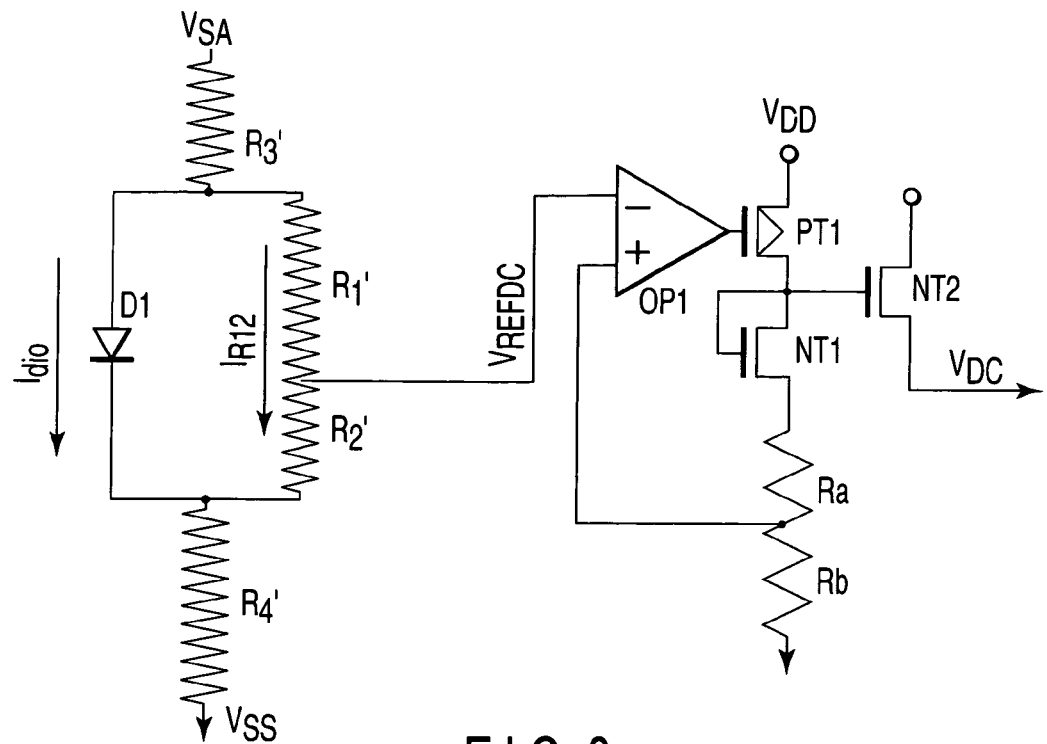
FIG. 9 is a circuit diagram showing the first configuration of a dummy capacitor driving voltage generation circuit included in a semiconductor storage device of a sixth embodiment of the present invention.
Figure 10:
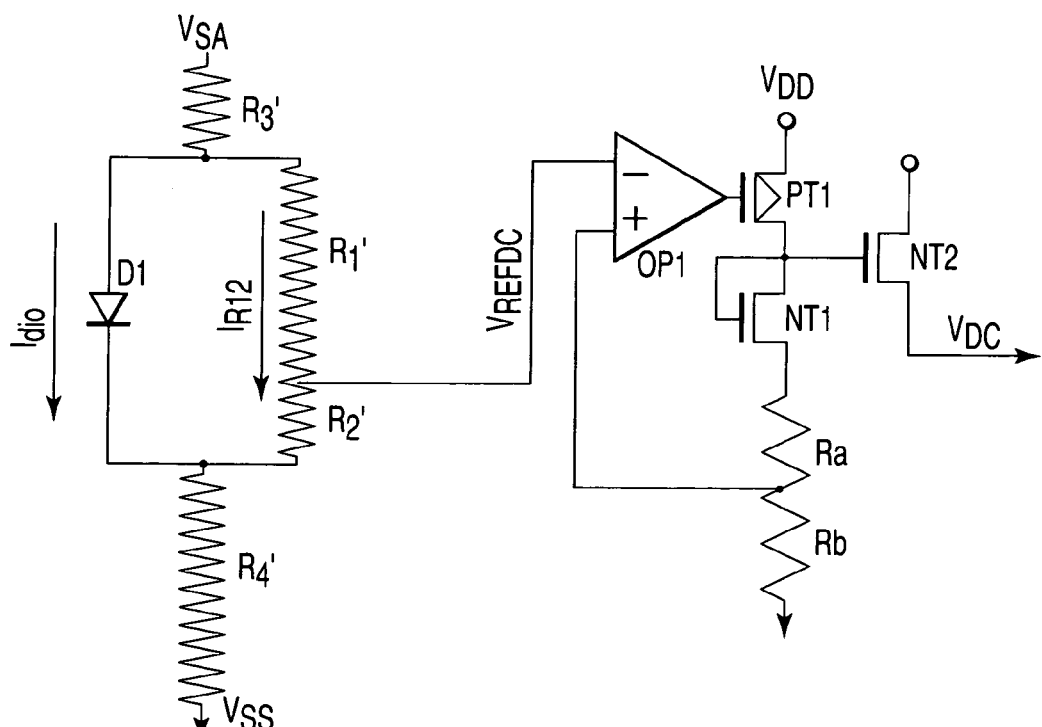
FIG. 10 is a circuit diagram showing the second configuration of the dummy capacitor driving voltage generation circuit included in the semiconductor storage device of the sixth embodiment of the present invention.
Figure 11:
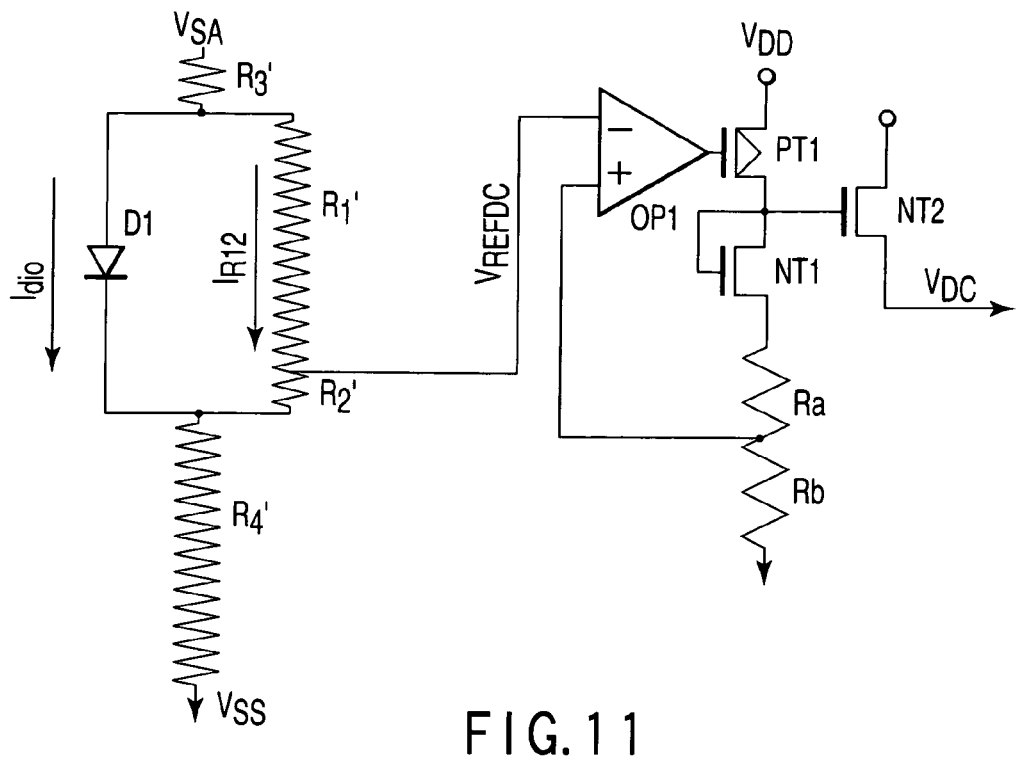
FIG. 11 is a circuit diagram showing the third configuration of the dummy capacitor driving voltage generation circuit included in the semiconductor storage device of the sixth embodiment of the present invention.
Figure 12:
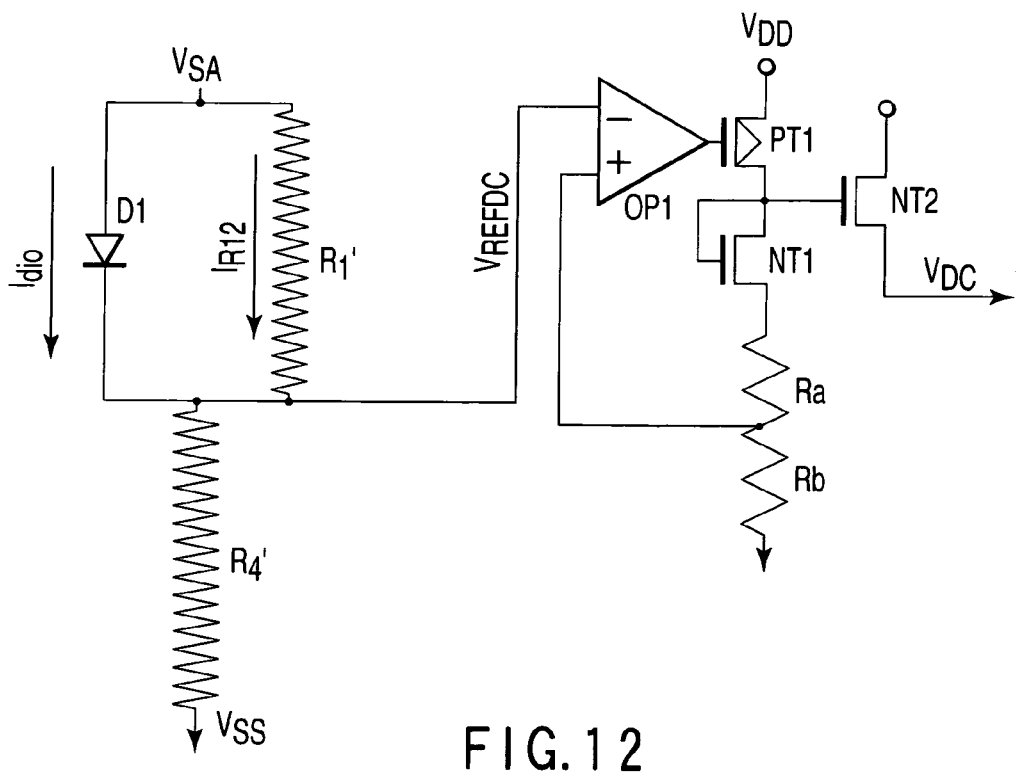
FIG. 12 is a circuit diagram showing the fourth configuration of the dummy capacitor driving voltage generation circuit included in the semiconductor storage device of the sixth embodiment of the present invention.
Figure 13:
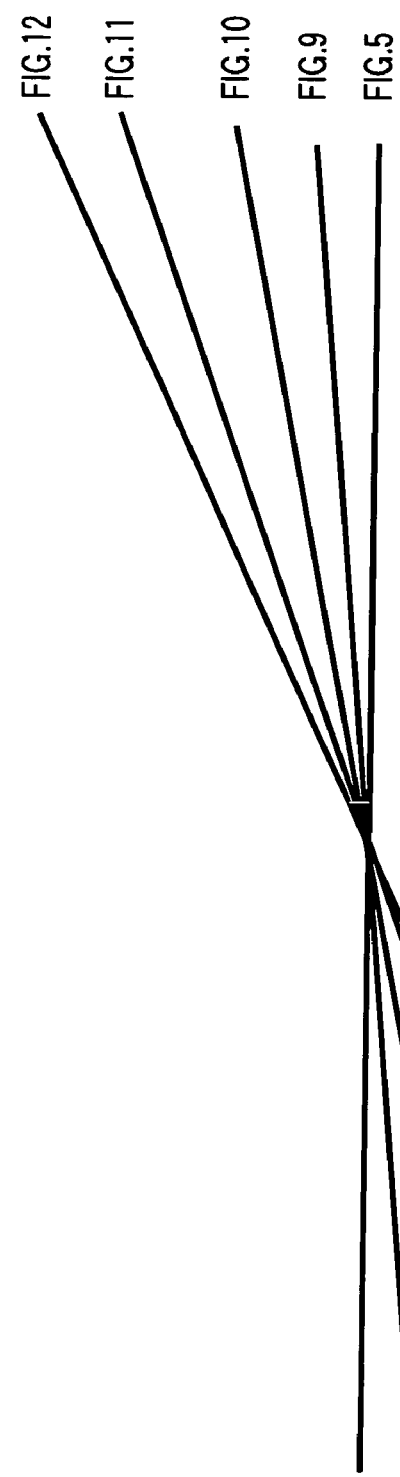
FIG. 13 is a graph showing the temperature dependences of dummy capacitor driving voltages output from the dummy capacitor driving voltage generation circuits according to the sixth embodiment of the present invention.

Assume that the current values in the third embodiment shown in FIG. 5 are those obtained at 27° C. Compared to the resistors when no temperature dependence is given in the circuit shown in FIG. 5, the resistance values in the circuit shown in FIG. 9 are $R_3' = R_3 - \Delta R$ $R_4' = R_3 + \Delta R$ $R_1' = R_1 + \Delta R \times (I_{dio} + I_{R12})/I_{R12}$ $R_2' = R_1 - \Delta R \times (I_{dio} + I_{R12})/I_{R12}$ $\Delta R = (1/4) \times R_3$ Likewise, the resistance values in the circuits shown in FIGS. 10, 11, and 12 are $\Delta R = (2/4) \times R_3$ $\Delta R = (3/4) \times R_3$ $\Delta R = (4/4) \times R_3$ FIG. 13 shows the temperature dependence of the dummy capacitor driving voltage $V_{DC}$ when the order of transition is FIG. 5→FIG. 9→FIG. 10→FIG. 11→FIG. 12. FIG. 13 reveals that the temperature dependence of the dummy capacitor driving voltage $V_{DC}$ can be changed by adjusting $\Delta R$.

Accordingly, it is possible, by using the dummy capacitor driving voltage generation circuits shown in FIGS. 9 to 12, to make the dummy capacitor driving voltage $V_{DC}$ follow the fluctuation in sense amplifier supply voltage $V_{SA}$, and give the dummy capacitor driving voltage $V_{DC}$ an optimum temperature dependence. This allows a reference potential used in a sense amplifier to follow the fluctuation in sense amplifier supply voltage $V_{SA}$, and gives the reference potential an optimum temperature dependence. Therefore, even if the temperature fluctuates, a sufficient sense margin can be ensured in the sense amplifier.

Also, when the sense amplifier supply voltage $V_{SA}$ is to be generated by using a voltage down converter using source-followered n cannel MOS transistor, the voltage generation circuits shown in FIGS. 9 to 12 can also be used as bleeder circuits by appropriately selecting the absolute values of resistors $R_1$ to $R_4$. This reduces the power consumption.

Seventh Embodiment

A temperature sensing circuit of the seventh embodiment of the present invention will be described below. This temperature sensing circuit of the seventh embodiment uses a part of the voltage generation circuit described above in temperature sensing.

Figure 14:
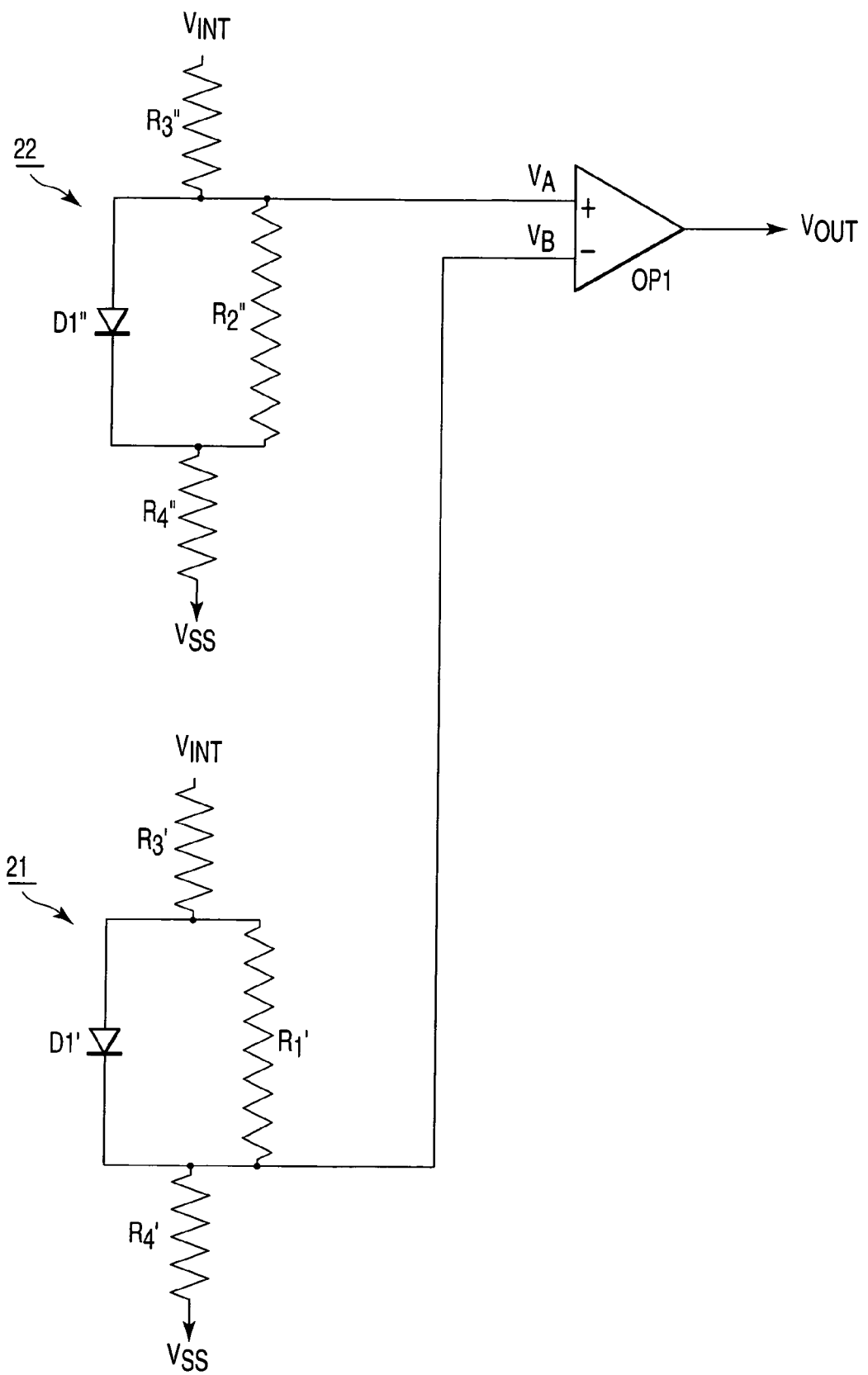
FIG. 14 is a circuit diagram showing the basic configuration of a temperature sensing circuit of a seventh embodiment of the present invention.

FIG. 14 is a circuit diagram showing the basic configuration of the temperature sensing circuit of the seventh embodiment.

This temperature sensing circuit includes first and second circuits 21 and 22 and an operational amplifier OP1. The first circuit 21 has a diode D1' and resistors $R_1'$, $R_3'$, and $R_4'$. The diode D1' and resistor $R_1'$ are connected in parallel, and the resistors $R_3'$ and $R_4'$ are connected in series with the two terminals of this parallel circuit. More specifically, the resistor $R_3'$ is connected to the anode (p-type semiconductor region) of the diode D1', and the resistor $R_4'$ is connected to the cathode (n-type semiconductor region) of the diode D1'. The resistor $R_3'$ is supplied with a voltage $V_{INT}$, and the resistor $R_4'$ is connected to, e.g., a ground potential $V_{SS}$. A voltage $V_B$ output from a node between the resistors $R_1'$ and $R_4'$ is input to the negative input terminal of the operational amplifier OP1. The voltage $V_{INT}$ is, e.g., a power supply voltage supplied to a sense amplifier in a semiconductor storage device, and is a constant electric potential regardless of the temperature.

The second circuit 22 has a diode D1" and resistors $R_2"$, $R_3"$, and $R_4"$. The diode D1" and resistor $R_2"$ are connected in parallel, and the resistors $R_3"$ and $R_4"$ are connected in series with the two terminals of this parallel circuit. More specifically, the resistor $R_3"$ is connected to the anode (p-type semiconductor region) of the diode D1", and the resistor $R_4"$ is connected to the cathode (n-type semiconductor region) of the diode D1". The resistor $R_3"$ is supplied with the voltage $V_{INT}$, and the resistor $R_4"$ is connected to, e.g., the ground potential $V_{SS}$. A voltage $V_A$ output from a node between the resistors $R_2"$ and $R_4"$ is input to the negative input terminal of the operational amplifier OP1. The operational amplifier OP1 outputs a voltage $V_{OUT}$ corresponding to the difference between the input voltages $V_A$ and $V_B$.

The first and second circuits 21 and 22 in the temperature sensing circuit shown in FIG. 14 will be explained below. The first and second circuits 21 and 22 have a temperature dependence by which the output voltages $V_B$ and $V_A$ change in accordance with the temperature.

FIG. 15 is a circuit diagram showing the basic configuration of the first and second circuits 21 and 22 in the temperature sensing circuit of the seventh embodiment. Series-connected resistors $R_1$ and $R_2$ and a diode D1 are connected in parallel, and resistors $R_3$ and $R_4$ are connected in series with the two terminals of this parallel circuit. More specifically, the resistor $R_3$ is connected to the anode (p-type semiconductor region) of the diode D1, and the resistor $R_4$ is connected to the cathode (n-type semiconductor region) of the diode D1. The resistor $R_3$ is supplied with the voltage $V_{INT}$, and the resistor $R_4$ is connected to, e.g., the ground potential $V_{SS}$. A voltage which is output from a node between the resistors $R_1$ and $R_2$ is $V_{TMP}$. The voltage $V_{INT}$ is, e.g., a power supply voltage supplied to a sense amplifier in a semiconductor storage device, and is a constant electric potential regardless of the temperature. Also, the resistance values of the resistors $R_1$ to $R_4$ can be adjusted by switching, and resistors having adjusted resistance values are indicated by $R_1'$ to $R_4'$ and $R_1''$ to $R_4''$ in the above and following descriptions.

Letting $I_{dio}$ be an electric current flowing through the diode D1, $I_{R12}$ be an electric current flowing through the resistors $R_1$ and $R_2$ connected in parallel to the diode D1, and $V_{dio}$ be the voltage across the two terminals of the diode D1, the voltage $V_{TMP}$ can be represented by $$V_{TMP} = \{V_{INT} - (I_{dio} + I_{R12}) \times (R_3 + R_4)\} \times R_2/(R_1 + R_2) + (I_{dio} + I_{R12}) \times R_4 \quad (24)$$

A case in which no temperature dependence is given to the voltage $V_{TMP}$ will be described first. To give no temperature dependence to the voltage $V_{TMP}$, the following condition is added.

$$R_1/R_2 = R_3/R_4 \quad (25)$$

Also, as shown in FIG. 15, especially when $$R_1 = R_2 \quad (26)$$

$$R_3 = R_4 \quad (27)$$

the voltage $V_{TMP}$ is $$V_{TMP} = (1/2) \times V_{INT} \quad (28)$$

The case in which no temperature dependence is given to the voltage $V_{TMP}$ is explained above. A case in which a temperature dependence is given to the voltage $V_{TMP}$ will be described below. FIGS. 16 to 19 illustrate a case in which the voltage $V_{TMP}$ is given a positive temperature dependence.

Assume that the current values indicated in the circuit shown in FIG. 15 are those obtained at 27° C. Compared to the resistors when no temperature dependence is given in the circuit shown in FIG. 15, the resistance values in the circuit shown in FIG. 16 are $$R_3' = R_3 - \Delta R \quad (29)$$

$$R_4' = R_3 + \Delta R \quad (30)$$

$$R_1' = R_1 + \Delta R \times (I_{dio} + I_{R12})/I_{R12} \quad (31)$$

$$R_2' = R_1 - \Delta R \times (I_{dio} + I_{R12})/I_{R12} \quad (32)$$

$$\Delta R = (1/4) \Delta R_3 \quad (33)$$

Figure 17:
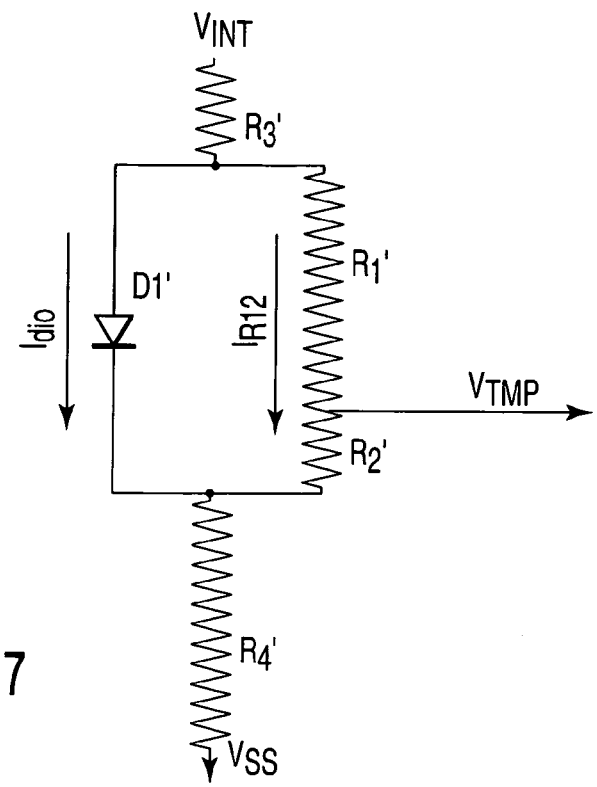
FIG. 17 is a circuit diagram showing a second configuration in which the circuit shown in FIG. 15 is given a positive temperature dependence.
Figure 18:
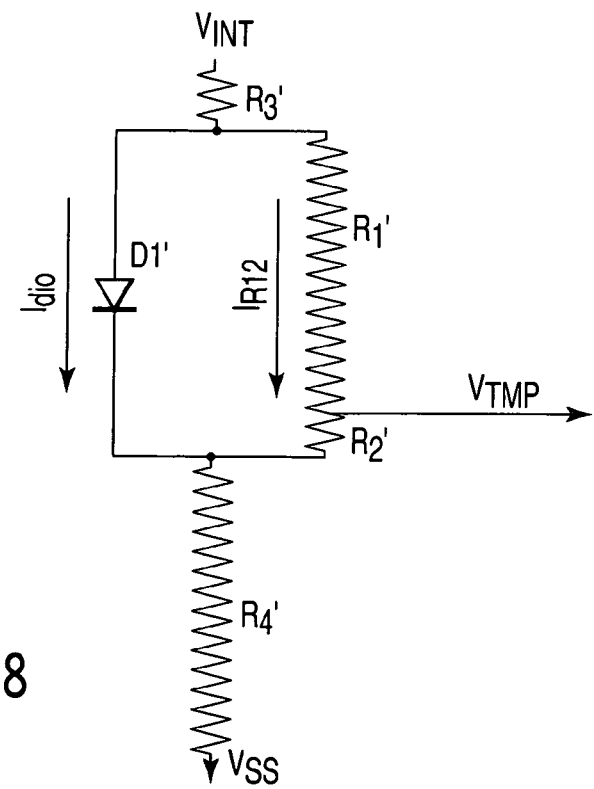
FIG. 18 is a circuit diagram showing a third configuration in which the circuit shown in FIG. 15 is given a positive temperature dependence.
Figure 19:
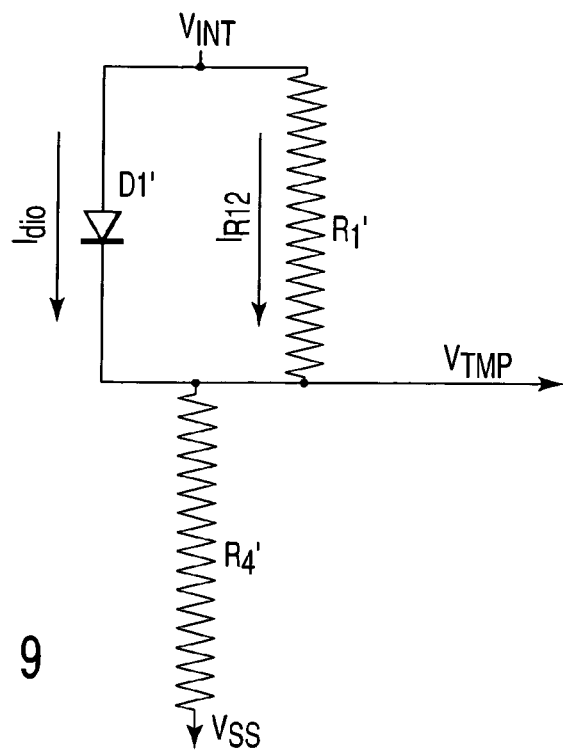
FIG. 19 is a circuit diagram showing a fourth configuration in which the circuit shown in FIG. 15 is given a positive temperature dependence.

Likewise, the resistance values in the cases of the circuit shown in FIGS. 17, 18, and 19 are $$\Delta R = (2/4) \times R_3 \quad (34)$$

$$\Delta R = (3/4) \times R_3 \quad (35)$$

$$\Delta R = (4/4) \times R_3 \quad (36)$$

Figure 20:
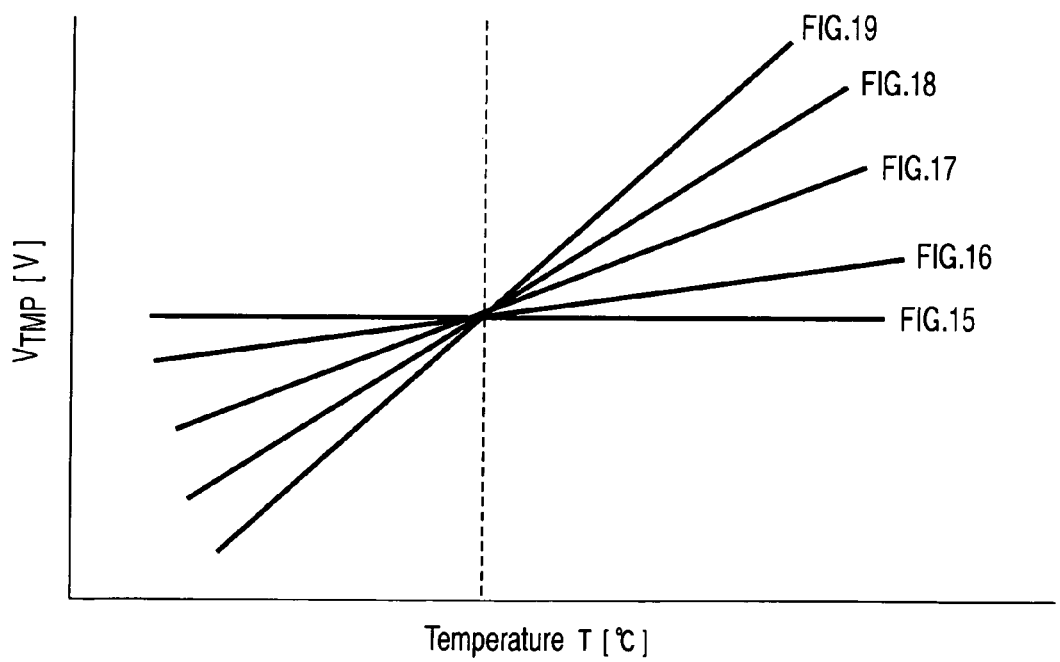
FIG. 20 is a graph showing the temperature dependences of voltages $V_{TMP}$ output from the circuits shown in FIGS. 15 to 19.
Figure 23:
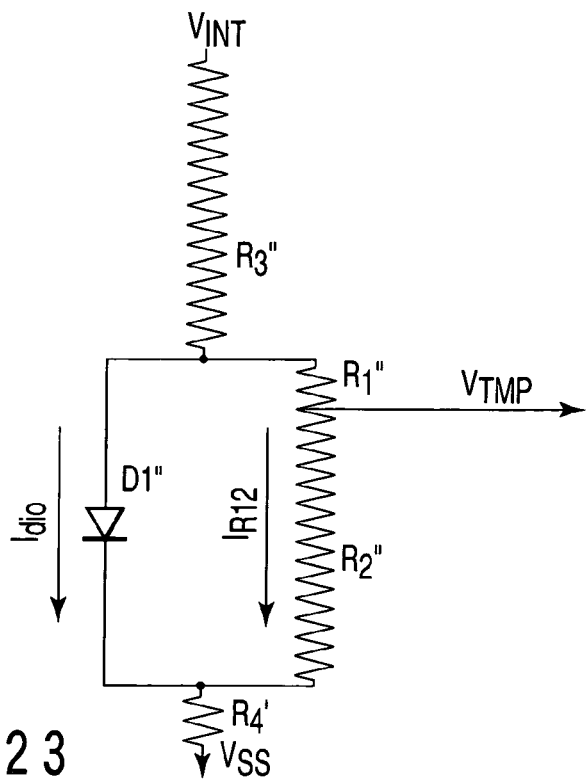
FIG. 23 is a circuit diagram showing a third configuration in which the circuit shown in FIG. 15 is given a negative temperature dependence.

FIG. 20 shows the temperature dependence of the voltage $V_{TMP}$ when the order of transition is FIG. 15→FIG. 16→FIG. 17→FIG. 18→FIG. 19. FIG. 20 reveals that the temperature dependence can be changed by adjusting $\Delta R$.

The case in which the voltage $V_{TMP}$ is given a positive temperature dependence is described above. A case in which a negative temperature dependence is given will be explained below. Compared to the resistors when no temperature dependence is given in the circuit shown in FIG. 15, $$R_3'' = R_3 - \Delta R \quad (37)$$

$$R_4'' = R_3 + \Delta R \quad (38)$$

$$R_1'' = R_1 + \Delta R \times (I_{dio} + I_{R12})/I_{R12} \quad (39)$$

$$R_2'' = R_1 - \Delta R \times (I_{dio} + I_{R12})/I_{R12} \quad (40)$$

$$\Delta R = -(1/4) \times R_3 \quad (41)$$

$$\Delta R = -(2/4) \times R_3 \quad (42)$$

$$\Delta R = -(3/4) \times R_3 \quad (43)$$

$$\Delta R = -(4/4) \times R_3 \quad (44)$$

need only hold. FIGS. 21 to 24 illustrate circuit diagrams corresponding to equations (41) to (44). Also, FIG. 25 shows the temperature dependence of the voltage $V_{TMP}$ when the order of transition is FIG. 15→FIG. 21→FIG. 22→FIG. 23→FIG. 24. In order for the following equation $$V_{TMP} = (1/2) \times V_{INT}$$

to always hold at a room temperature of 27° C., the resistance values need only be adjusted as indicated by equation (44) from equation (33) by $$R_1 = R_2 = Vdio(27° C.)/(2 \times I_{R12}) \quad (45)$$

$$R_1 = R_2 = \{V_{INT} - Vdio(27° C.)\}/(Idio + I_{R12}) \quad (46)$$

Also, in order for the following equation $$V_{TMP} = (1/2) \times V_{INT}$$

to always hold at different temperatures (T° C.), $$R_1 = R_2 = Vdio(T° C.)/(2 \times I_{R12}) \quad (47)$$

$$R_3 = R_4 = \{V_{INT} - Vdio(T° C.)\}/(Idio + I_{R12}) \quad (48)$$

need only hold.

Figure 24:
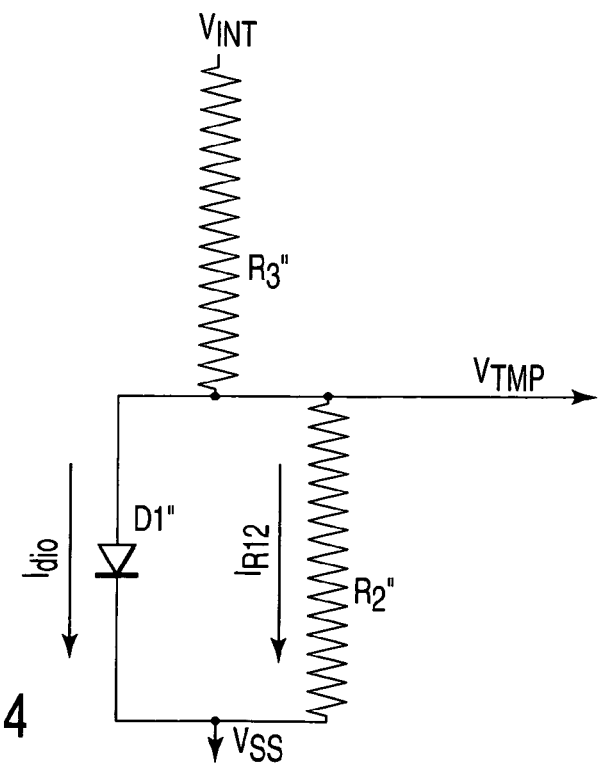
FIG. 24 is a circuit diagram showing a fourth configuration in which the circuit shown in FIG. 15 is given a negative temperature dependence.
Figure 25:
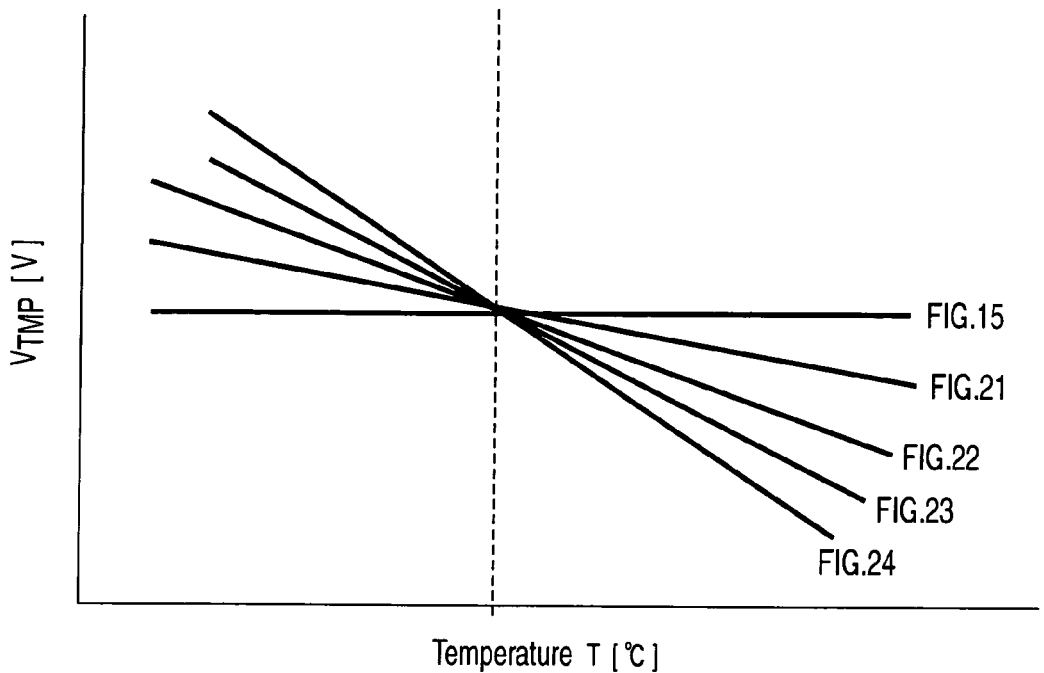
FIG. 25 is a graph showing the temperature dependences of voltages $V_{TMP}$ output from the circuits shown in FIGS. 21 to 24.
Figure 26:
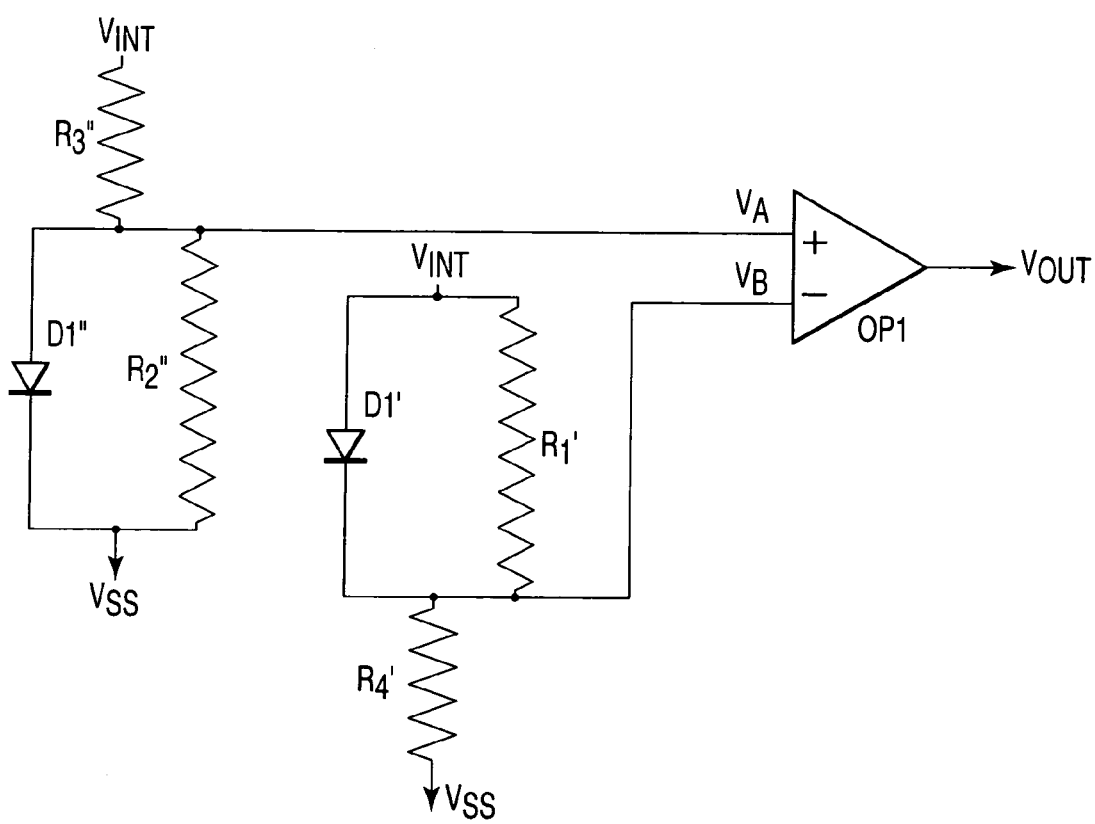
FIG. 26 is a circuit diagram showing the arrangement of the temperature sensing circuit of the seventh embodiment.
Figure 27:
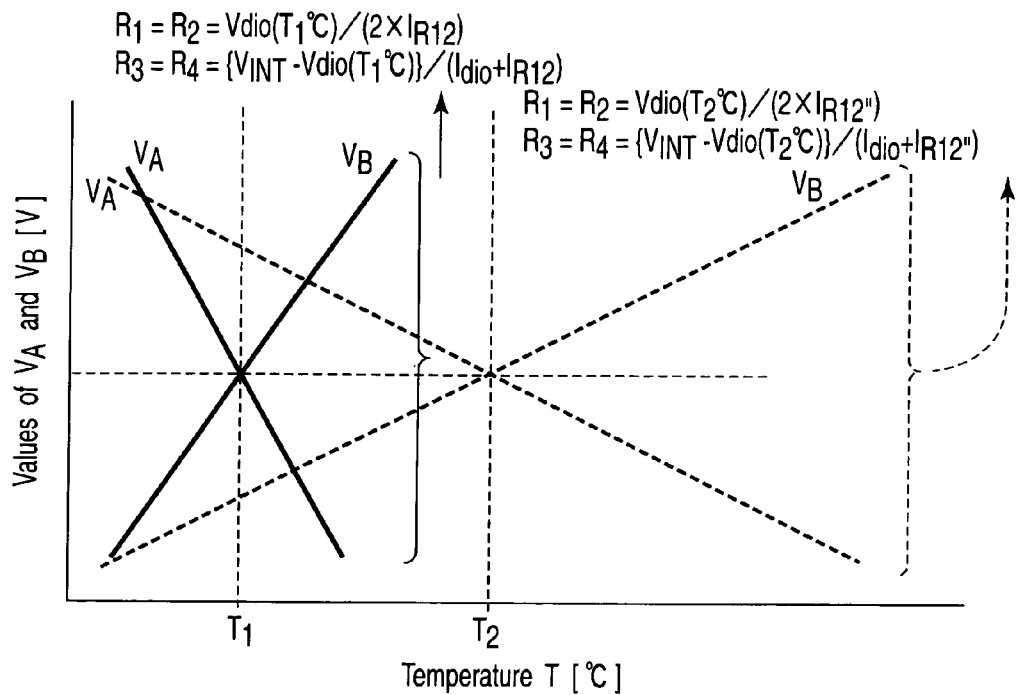
FIG. 27 is a graph showing the temperature dependences of voltages $V_A$ and $V_B$ output from the circuit showing in FIG. 26.

FIG. 26 shows a temperature sensing circuit when the outputs of the circuits shown in FIGS. 19 and 24, i.e., the voltages $V_{TMP}$ having the positive and negative temperature dependences are input to the operational amplifier OP1. Reference symbol $V_B$ denotes the voltage $V_B$ ($V_{TMP}$) having the positive temperature dependence; and $V_A$, the voltage $V_A$ ($V_{TMP}$) having the negative temperature dependence. If the temperature dependence of the voltage $V_{dio}$ is checked beforehand in equations (47) and (48), the voltage $V_{TMP}$ ($V_A$, $V_B$) can be given a temperature dependence centering around $$V_{TMP} = (1/2) \times V_{INT}$$

over a wide temperature range, as shown in FIG. 27, by adjusting the resistance values of the resistors R1 to R4.

Figure 28:
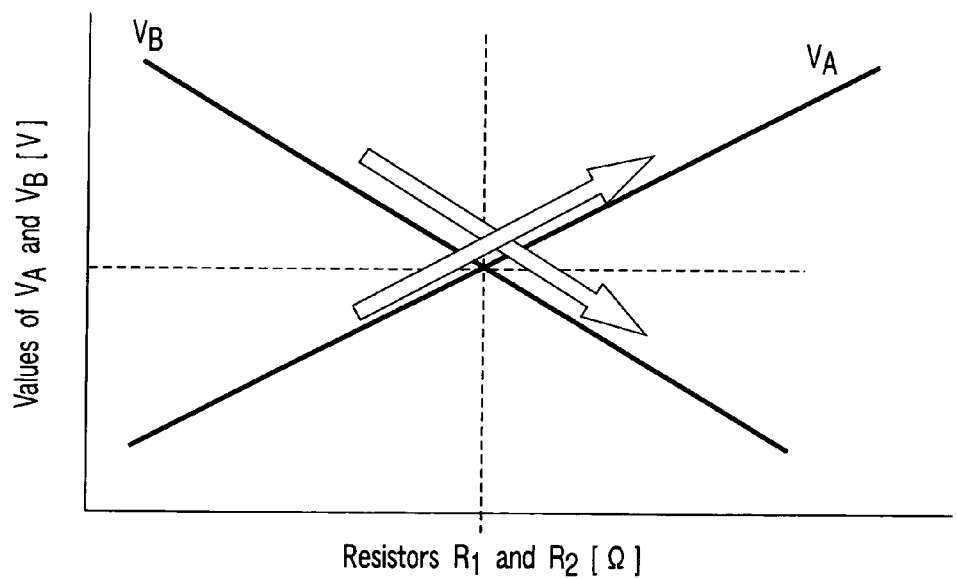
FIG. 28 is a graph showing the resistance value dependences of the voltages $V_A$ and $V_B$ output from the circuit showing in FIG. 26.

If the resistors $R_1'$, $R_2''$, $R_3''$, and $R_4'$ are set as shown in FIG. 26 by adjusting the resistance values of the resistors $R_1$ to $R_4$ by switching transistors or the like, the voltages $V_A$ and $V_B$ change as shown in FIG. 28, and the output voltage $V_{OUT}$ of the operational amplifier OP1 inverts at a certain switching address at a certain temperature. That is, a switching address of a switching transistor at which the output voltage $V_{OUT}$ of the operational amplifier OP1 inverts is determined on the basis of the temperature. Therefore, the temperature of interest can be sensed by obtaining a switching address (inversion address) at which the output voltage $V_{OUT}$ inverts.

Figure 29:
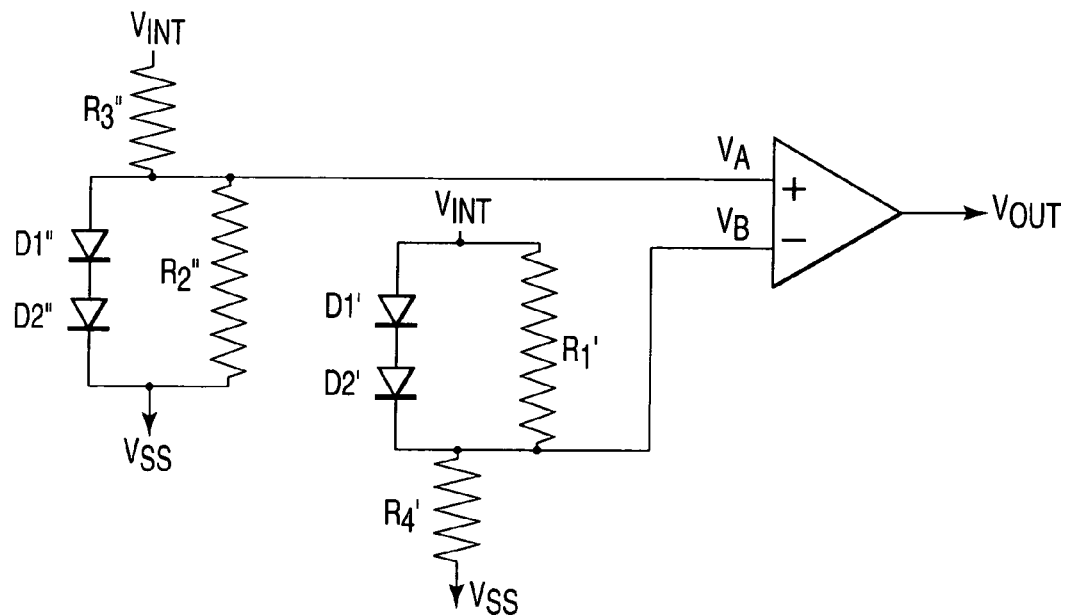
FIG. 29 is a circuit diagram showing the arrangement of a temperature sensing circuit of a modification of the seventh embodiment.

FIG. 29 is a view showing the arrangement of a temperature sensing circuit of a modification of the seventh embodiment. Although the seventh embodiment shown in FIG. 26 is an example in which a diode and resistor are connected in parallel, a plurality of series-connected diodes and a resistor may also be connected in parallel. For example, as shown in FIG. 29, when series-connected diodes D1" and D2" and a resistor $R_2''$, or series-connected diodes D1' and D2' and a resistor $R_1$, are connected in parallel, the conditions need only be set such that the voltage $V_{dio}$ is $2 \times V_{dio}$ in the explanation of the seventh embodiment. The rest of the arrangement and the effect are the same as in the seventh embodiment described above.

Eighth Embodiment

A temperature sensing circuit of the eighth embodiment of the present invention will be described below. As in the seventh embodiment, this temperature sensing circuit of the eighth embodiment uses a part of the voltage generation circuit described above in temperature sensing.

Figure 30:
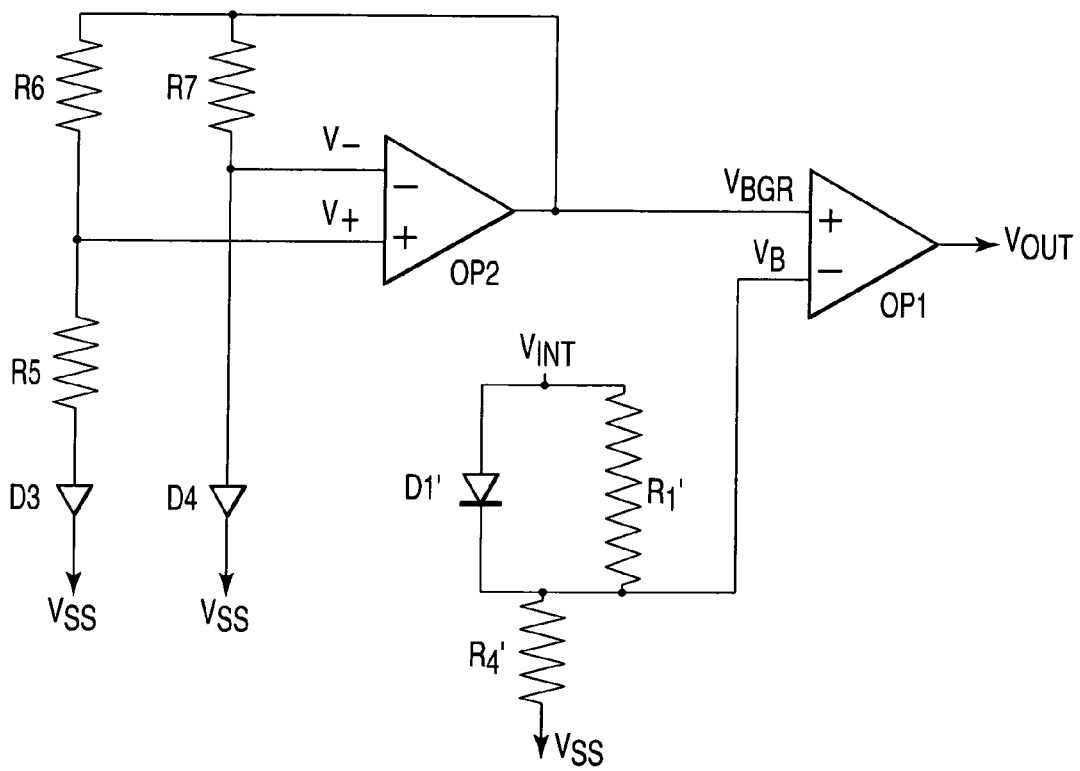
FIG. 30 is a circuit diagram showing the arrangement of a temperature sensing circuit of an eighth embodiment of the present invention.

FIG. 30 is a circuit diagram showing the arrangement of the temperature sensing circuit of the eighth embodiment. In the seventh embodiment described above, voltages having positive and negative temperature dependences are input to the input terminals of the operational amplifier. In the eighth embodiment, however, a reference voltage $V_{BGR}$ output from a bandgap reference (BGR) circuit is input to the positive input terminal, and a voltage $V_B$ ($V_{TMP}$) having a positive temperature dependence is input to the negative input terminal from the circuit shown in FIG. 19. Note that the reference voltage $V_{BGR}$ output from the bandgap reference (BGR) circuit is a constant voltage independent of the temperature.

The circuit which outputs the voltage $V_B$ has the same configuration as described in the seventh embodiment. The bandgap reference (BGR) circuit which outputs the reference voltage $V_{BGR}$ includes an operational amplifier OP2, diodes D3 and D4, and resistors R5, R6, and R7. The positive (+) input terminal of the operational amplifier OP2 is connected to a ground potential $V_{SS}$ via the resistor R5 and diode D3 connected in series, and to the output terminal of the operational amplifier OP2 via the resistor R6. The negative (−) input terminal of the operational amplifier OP2 is connected to the ground potential $V_{SS}$ via the diode D4, and to a connecting point between the output terminal of the operational amplifier OP2 and the resistor R6 via the resistor R7. The bandgap reference circuit having this configuration generates the reference voltage $V_{BGR}$ which is independent of the temperature as described above.

Assume that this reference voltage independent of the temperature is $V_{BGR} = \frac{1}{2} \times V_{INT}$. If resistors $R_1'$ and $R_4'$ are set as shown in FIG. 30 by adjusting the resistance values of resistors $R_1$ to $R_4$ by using switching transistors or the like, the voltages $V_{BGR}$ and $V_B$ change as shown in FIG. 31, and an output voltage $V_{OUT}$ of an operational amplifier OP1 inverts at a switching address corresponding to the temperature. Accordingly, the temperature of interest can be sensed by obtaining a switching address (inversion address) at which the output voltage $V_{OUT}$ inverts.

FIG. 32 is a view showing the arrangement of a temperature sensing circuit of a modification of the eighth embodiment. Although the circuit which outputs the voltage $V_B$ in the eighth embodiment shown in FIG. 30 is an example in which a diode and resistor are connected in parallel, a plurality of series-connected diodes and a resistor may also be connected in parallel. For example, as shown in FIG. 32, when series-connected diodes D1' and D2' and a resistor $R_1'$ are connected in parallel, the conditions need only be set such that a voltage $V_{dio}$ is $2 \times V_{dio}$ in the eighth embodiment. The rest of the arrangement and the effect are the same as in the eighth embodiment described above.

Ninth Embodiment

A temperature sensing circuit of the ninth embodiment of the present invention will be described below. As in the seventh embodiment, this temperature sensing circuit of the ninth embodiment uses a part of the voltage generation circuit described above in temperature sensing.

Figure 33:
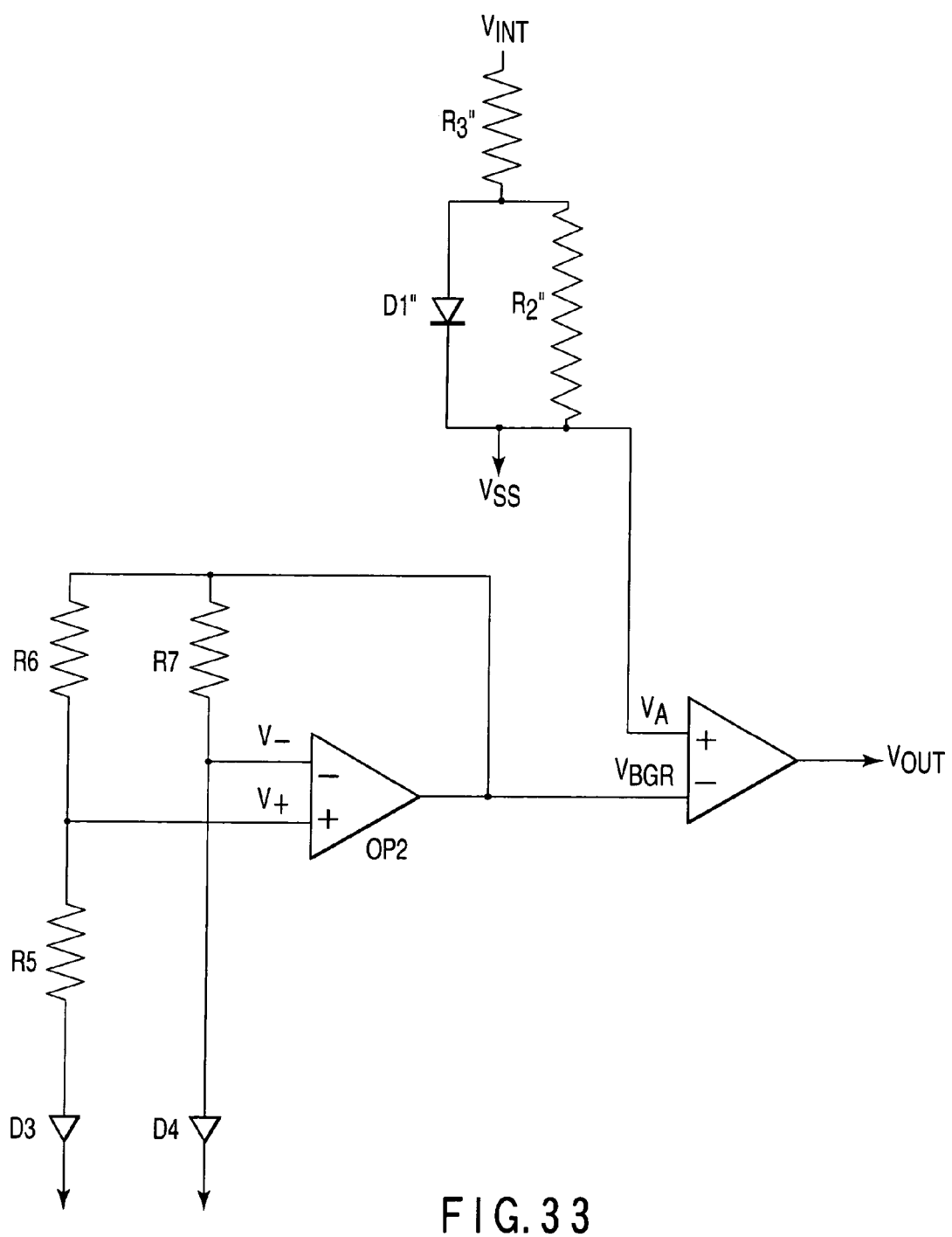
FIG. 33 is a circuit diagram showing the arrangement of a temperature sensing circuit of a ninth embodiment of the present invention.

FIG. 33 is a circuit diagram showing the arrangement of the temperature sensing circuit of the ninth embodiment. In the seventh embodiment described above, voltages having positive and negative temperature dependences are input to the input terminals of the operational amplifier. In the ninth embodiment, however, a voltage $V_A$ ($V_{TMP}$) having a negative temperature dependence is input to the positive input terminal from the circuit shown in FIG. 24, and a reference voltage $V_{BGR}$ output from a bandgap reference (BGR) circuit is input to the negative input terminal. Note that the configuration of the bandgap reference (BGR) circuit is the same as that shown in FIG. 30, and the reference voltage $V_{BGR}$ is a constant voltage independent of the temperature. Note also that the circuit which outputs the voltage $V_A$ has the same configuration as described in the seventh embodiment.

Figure 34:
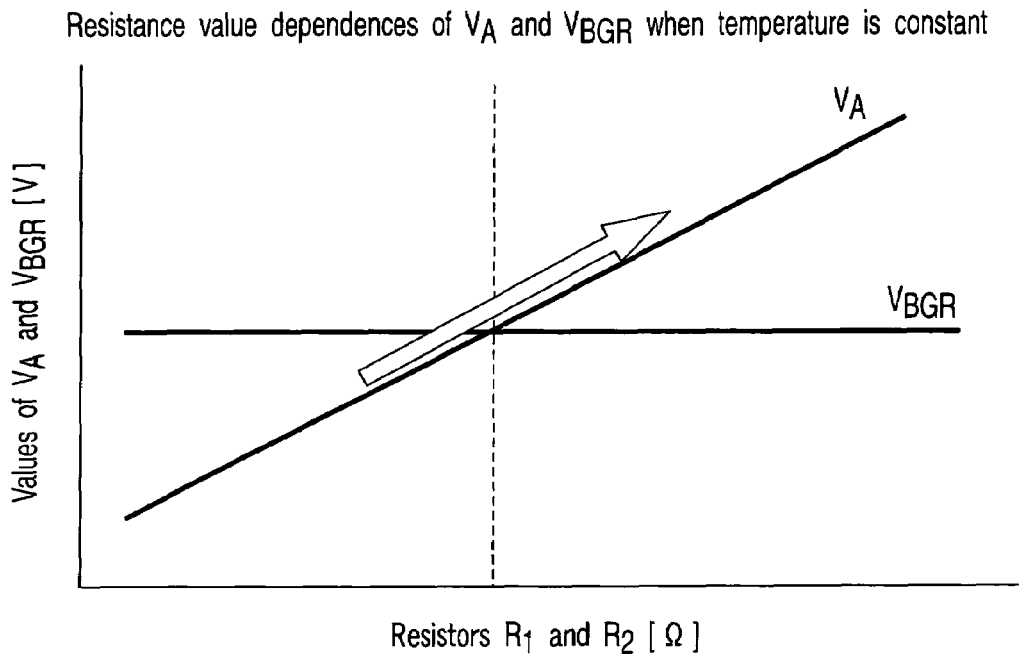
FIG. 34 is a graph showing the resistance value dependences of voltages $V_A$ and $V_{BGR}$ in the temperature sensing circuit of the ninth embodiment.

Assume that the reference voltage independent of the temperature is $V_{BGR} = (\frac{1}{2}) \times V_{INT}$. If resistors $R_2''$ and $R_3''$ are set as shown in FIG. 33 by adjusting the resistance values of resistors $R_1$ to $R_4$ by using switching transistors or the like, the voltages $V_A$ and $V_{BGR}$ change as shown in FIG. 34, and an output voltage $V_{OUT}$ of an operational amplifier OP1 inverts at a switching address corresponding to the temperature of interest. Accordingly, the temperature of interest can be sensed by obtaining a switching address (inversion address) at which the output voltage $V_{OUT}$ inverts.

Figure 35:
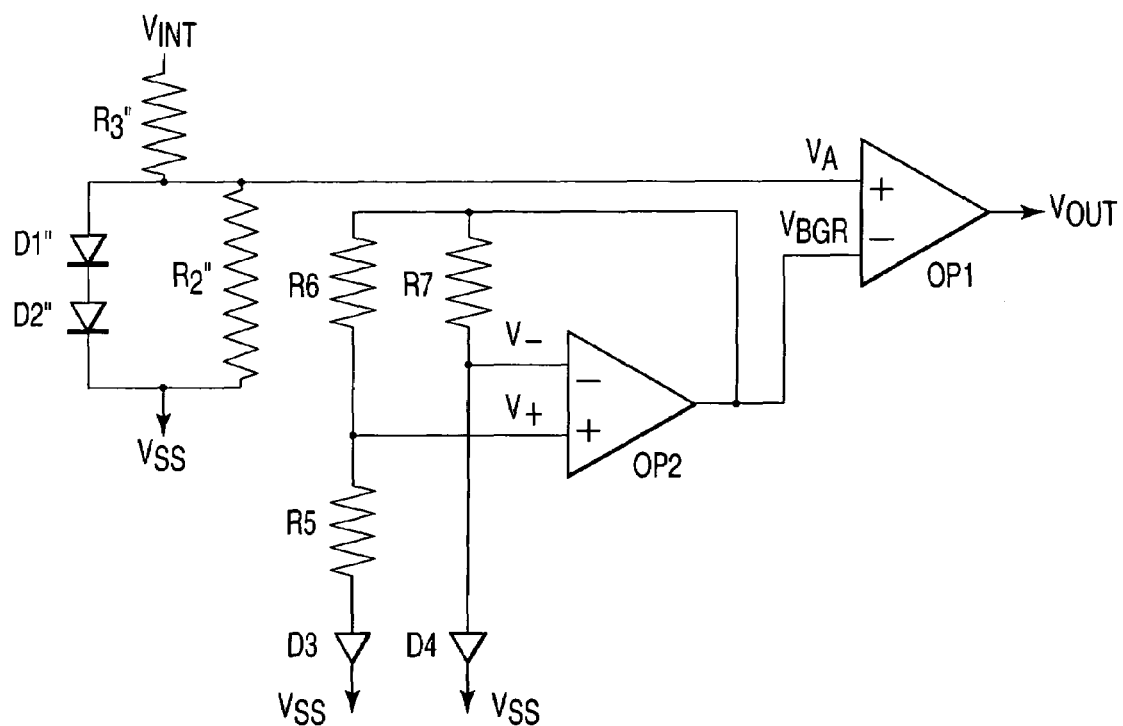
FIG. 35 is a circuit diagram showing the arrangement of a temperature sensing circuit of a modification of the ninth embodiment.
Figure 36A:
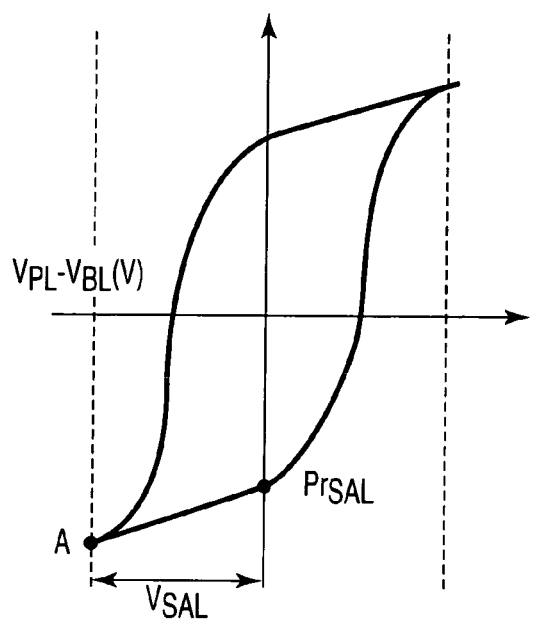
FIGS. 36A and 36B show hysteresis curves indicating that a dummy capacitor driving voltage has dependence on a sense amplifier supply voltage.
Figure 36B:
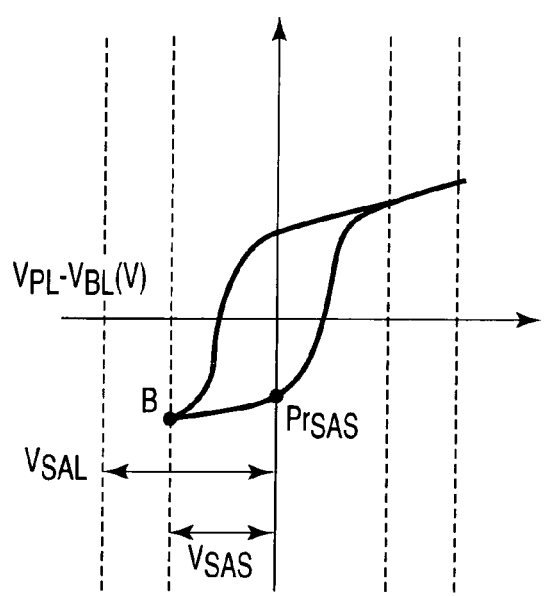

FIG. 35 is a view showing the arrangement of a temperature sensing circuit of a modification of the ninth embodiment. Although the circuit which outputs the voltage $V_A$ in the ninth embodiment shown in FIG. 33 is an example in which a diode and resistor are connected in parallel, a plurality of series-connected diodes and a resistor may also be connected in parallel. For example, as shown in FIG. 35, when series-connected diodes D1'' and D2'' and a resistor $R_2''$ are connected in parallel, the conditions need only be set such that a voltage $V_{dio}$ is $2 \times V_{dio}$ in the ninth embodiment. The rest of the arrangement and the effect are the same as in the ninth embodiment described above.

In the seventh to ninth embodiments as explained above, the temperature can be sensed with a small area by simple switching of switching transistors or the like, without adding any new temperature-dependent bandgap reference circuit or changing the operating point of an operational amplifier.

Each embodiment of the present invention can provide a voltage generation circuit capable of varying a dummy capacitor driving voltage used to generate a reference voltage for use in a sense amplifier, by following the fluctuation in sense amplifier supply voltage which is supplied to the sense amplifier and used by the sense amplifier to compare and amplify bit line potentials. In addition, each embodiment of the present invention can provide a temperature sensing circuit capable of simply sensing the temperature with a small area, without adding any new temperature-dependent bandgap reference circuit or changing the operating point of an operational amplifier.

Also, the individual embodiments described above can be practiced not only singly but also in the form of appropriate combinations. Furthermore, the individual embodiments described above include inventions in various stages, so these inventions in various stages can be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
a memory cell which stores information;
a first bit line connected to the memory cell;
a dummy cell having a dummy capacitor;
a second bit line connected to the dummy cell, and supplied with an electric potential complementary to an electric potential of the first bit line;
a sense amplifier which compares and amplifies the electric potential of the first bit line and the electric potential of the second bit line;
a sense amplifier supply voltage generation circuit which supplies the sense amplifier with a sense amplifier supply voltage to be used in the comparison and amplification by the sense amplifier; and
a reference voltage generation circuit which is supplied with the sense amplifier supply voltage and, when data is read out from the memory cell to the first bit line, supplies, to the second bit line via the dummy cell, a reference potential which fluctuates with a positive correlation to a fluctuation in the sense amplifier supply voltage.

2. The semiconductor storage device according to claim 1, wherein the reference voltage generation circuit comprises a bleeder circuit which has a resistor connected between the sense amplifier supply voltage and a ground potential and keeps flowing a constant electric current to the resistor, and outputs a reference voltage for generating the reference potential from a node midway along the resistor.

3. The semiconductor storage device according to claim 1, wherein the reference potential generation circuit comprises:
a first resistor and diode connected in parallel;
a second resistor having one terminal connected to an anode of the diode, and the other terminal supplied with the sense amplifier supply voltage; and
a third resistor having one terminal connected to a cathode of the diode, and the other terminal connected to the ground potential, and
outputs a reference voltage for generating the reference potential from a node midway along any of the first resistor, the second resistor, and the third resistor.

4. The semiconductor storage device according to claim 3, wherein in a configuration in which the first resistor is divided into two resistors R1 and R2 and the reference voltage is output from a connecting point between the resistors R1 and R2, letting R3 be the second resistor and R4 be the third resistor, the reference voltage is given no temperature dependence by setting R1/R2=R3/R4.

5. The semiconductor storage device according to claim 4, wherein the reference voltage =(½)×(the sense amplifier supply voltage) is set by setting R1=R2 and R3=R4 in R1, R2, R3, and R4.

6. The semiconductor storage device according to claim 4, wherein letting $I_{dio}$ be an electric current flowing through the diode and $I_{R12}$ be an electric current flowing through R1 and R2, the reference voltage is given temperature dependence by changing a resistance value of R3 to satisfy equations below, $$R3'=R3-\Delta R$$

$$R4'=R4+\Delta R$$

$$R1'=R1+\Delta R \times (I_{dio}+I_{R12})/I_{R12}$$

$$R2'=R2-\Delta R \times (I_{dio}+I_{R12})/I_{R12}$$

7. The semiconductor storage device according to claim 6, wherein a temperature dependence of the reference potential generated on the basis of the reference voltage is equal to temperature dependences of central values of peaks of a "0" signal distribution and "1" signal distribution in the memory cell.

8. The semiconductor storage device according to claim 1, wherein
the memory cell has a ferroelectric capacitor and a transfer gate comprising a MOS transistor, a first electrode and second electrode of the ferroelectric capacitor are connected to a plate line and a source of the MOS transistor, respectively, and a drain is connected to the first bit line, and
the reference potential generation circuit comprises a dummy capacitor voltage generation circuit which generates a dummy capacitor voltage to be supplied to the dummy capacitor via the plate line, and a dummy capacitor driving circuit which drives the dummy capacitor with the dummy capacitor voltage.

9. The semiconductor storage device according to claim 1, wherein
the memory cell has a ferroelectric capacitor and a first MOS transistor, a first electrode and second electrode of the ferroelectric capacitor are connected to a source and drain of the first MOS transistor, respectively, and a gate of the first MOS transistor is connected to a word line,
the memory cell comprises a plurality of series-connected memory cells, a plate line is connected to one terminal of the series-connected memory cells, and a bit line is connected to the other terminal of the series-connected memory cells via a second MOS transistor for block selection, and
the reference potential generation circuit includes a dummy capacitor voltage generation circuit which generates a dummy capacitor voltage to be supplied to the dummy capacitor via the plate line.

10. The semiconductor storage device according to claim 1, wherein the reference voltage generation circuit includes a temperature sensing circuit,
the temperature sensing circuit comprising
a first circuit which outputs a first voltage having a positive temperature dependence from a connecting point between a first resistor and a second resistor, the first circuit comprising
the first resistor and second resistor connected in series,
a first diode having an anode connected to one terminal of the series-connected first resistor and second resistor, and a cathode connected to the other terminal of the series-connected first resistor and second resistor,
a third resistor having one terminal connected to the anode of the first diode, and the other terminal supplied with a predetermined voltage, and a fourth resistor having one terminal connected to the cathode of the first diode, and the other terminal connected to a ground potential;

a second circuit which outputs a second voltage having a negative temperature dependence from a connecting point between a fifth resistor and a sixth resistor, the second circuit comprising the fifth resistor and sixth resistor connected in series, a second diode having an anode connected to one terminal of the series-connected fifth resistor and sixth resistor, and a cathode connected to the other terminal of the series-connected fifth resistor and sixth resistor, a seventh resistor having one terminal connected to the anode of the second diode, and the other terminal supplied with the predetermined voltage, and an eighth resistor having one terminal connected to the cathode of the second diode, and the other terminal connected to the ground potential; and an operational amplifier circuit which receives the first voltage and the second voltage, and outputs a voltage based on a result of an operation using the first voltage and the second voltage; and the memory cell includes a ferroelectric capacitor, wherein the predetermined voltage as the sense amplifier supply voltage is applied to between both electrodes of the ferroelectric capacitor.

* * * * *